(12) United States Patent
Nguyen et al.

(10) Patent No.: US 11,437,318 B2
(45) Date of Patent: Sep. 6, 2022

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventors: Qui V. Nguyen, San Jose, CA (US); Chang H. Siau, Sartoga, CA (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 16/900,204

(22) Filed: Jun. 12, 2020

(65) Prior Publication Data

US 2021/0391257 A1 Dec. 16, 2021

(51) Int. Cl.
*H01L 23/528* (2006.01)
*H01L 23/522* (2006.01)
*H01L 23/535* (2006.01)
*H01L 27/11519* (2017.01)
*H01L 27/11524* (2017.01)
(Continued)

(52) U.S. Cl.
CPC ...... *H01L 23/5283* (2013.01); *H01L 23/5226* (2013.01); *H01L 23/535* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
None
See application file for complete search history.

(56) References Cited

U.S. PATENT DOCUMENTS 4,920,517 A 4/1990 Yamauchi et al.
5,761,148 A 6/1998 Allan et al.
(Continued)

FOREIGN PATENT DOCUMENTS

WO 2018/161836 A1 9/2018

OTHER PUBLICATIONS

International Search Report for Application No. PCT/US2021/033214, dated Sep. 15, 2021, 5 pages.
(Continued)

*Primary Examiner* — Hsien Ming Lee
(74) *Attorney, Agent, or Firm* — TraskBritt

(57) ABSTRACT

A microelectronic device comprises blocks, contact structures, filled vias, and a base structure. The blocks each have a vertically alternating sequence of conductive structures and insulative structures arranged in tiers. Each block comprises a forward staircase structure and a reverse staircase structure. The contact structures are on steps of the forward staircase structure of a first of the blocks and on additional steps of the reverse staircase structure of a second of the blocks horizontally neighboring the first of the blocks. The filled vias extend through portions of the first of the blocks within horizontal boundaries of the reverse staircase structure of the first of the blocks and extend through portions of the second of the blocks within horizontal boundaries of the forward staircase structure of the second of the blocks. The base structure underlies the blocks and comprises transistors coupled to the filled vias.

13 Claims, 12 Drawing Sheets

(51) Int. Cl.
  *H01L 27/11529* (2017.01)
  *H01L 27/11556* (2017.01)
  *H01L 27/11565* (2017.01)
  *H01L 27/1157* (2017.01)
  *H01L 27/11573* (2017.01)
  *H01L 27/11582* (2017.01)

(56) References Cited

U.S. PATENT DOCUMENTS

| | | | |
|---|---|---|---|
| 6,762,959 | B2 | 7/2004 | Kim |
| 8,125,829 | B2 | 2/2012 | Tanzawa |
| 8,325,527 | B2 | 12/2012 | Jin et al. |
| 8,542,534 | B2 | 9/2013 | Yamada et al. |
| 8,737,157 | B2 | 5/2014 | Kim et al. |
| 8,765,598 | B2 | 7/2014 | Smith et al. |
| 8,933,502 | B2 | 1/2015 | Higashitani et al. |
| 8,951,859 | B2 | 2/2015 | Higashitani et al. |
| 8,971,117 | B2 | 3/2015 | Tanzawa |
| 8,995,188 | B2 | 3/2015 | Tanzawa |
| 9,001,584 | B2 | 4/2015 | Ha |
| 9,147,473 | B2 | 9/2015 | Kim et al. |
| 9,165,937 | B2 | 10/2015 | Yip et al. |
| 9,412,451 | B2 | 8/2016 | Tanzawa et al. |
| 9,443,593 | B2 | 9/2016 | Hosono |
| 9,449,966 | B2 | 9/2016 | Chen |
| 9,589,978 | B1 | 3/2017 | Yip |
| 9,728,548 | B2 | 8/2017 | Freeman et al. |
| 9,941,209 | B2 | 4/2018 | Tessariol et al. |
| 10,269,625 | B1 | 4/2019 | Matovu et al. |
| 10,546,872 | B2 | 1/2020 | Chae et al. |
| 2006/0120154 | A1 | 6/2006 | Lee |
| 2007/0252201 | A1 | 11/2007 | Kito et al. |
| 2009/0212350 | A1 | 8/2009 | Kidoh et al. |
| 2009/0285026 | A1 | 11/2009 | Kang |
| 2009/0310415 | A1 | 12/2009 | Jin et al. |
| 2011/0244666 | A1 | 10/2011 | Kim et al. |
| 2011/0267912 | A1 | 11/2011 | Juengling |
| 2012/0068253 | A1 | 3/2012 | Oota et al. |
| 2013/0009274 | A1 | 1/2013 | Lee et al. |
| 2013/0020647 | A1 | 1/2013 | Hwang et al. |
| 2014/0061747 | A1 | 3/2014 | Tanzawa et al. |
| 2014/0098611 | A1 | 4/2014 | Tanzawa |
| 2015/0228623 | A1 | 8/2015 | Oh et al. |
| 2016/0163732 | A1 | 6/2016 | Lim et al. |
| 2017/0179026 | A1 | 6/2017 | Toyama et al. |
| 2018/0076211 | A1* | 3/2018 | Inatsuka ............. H01L 27/1157 |
| 2019/0043873 | A1 | 2/2019 | Hasnat et al. |
| 2019/0393241 | A1 | 12/2019 | Baek et al. |

OTHER PUBLICATIONS

Written Opinion of the International Searching Authority for Application No. PCT/US2021/033214, dated Sep. 15, 2021, 12 pages.

* cited by examiner

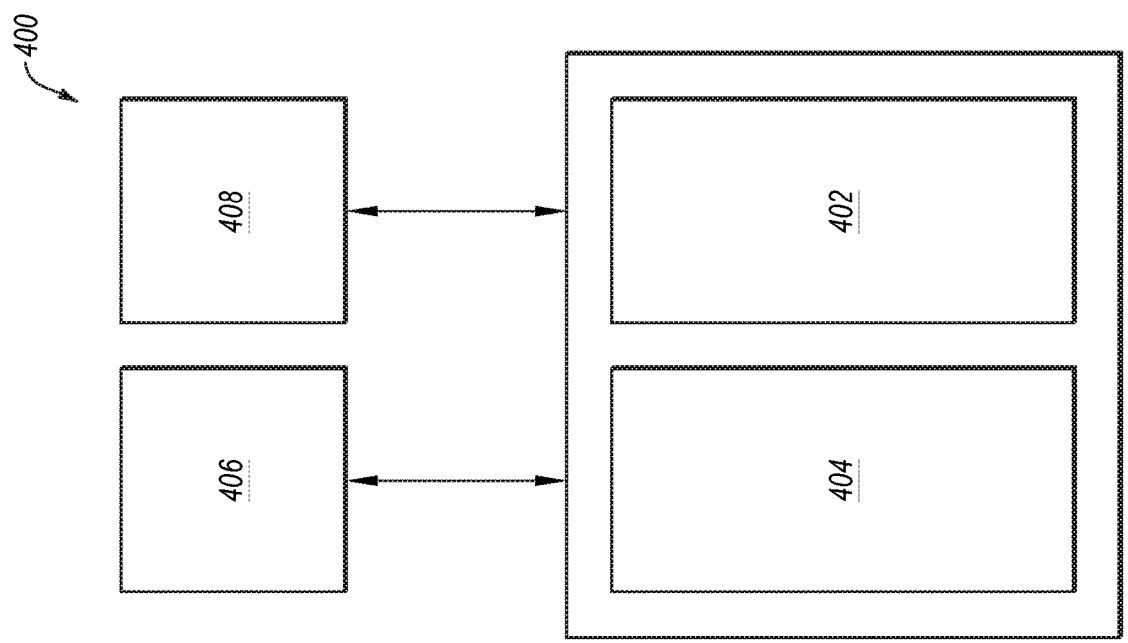

US 11,437,318 B2

MICROELECTRONIC DEVICES INCLUDING STAIRCASE STRUCTURES, AND RELATED MEMORY DEVICES AND ELECTRONIC SYSTEMS

TECHNICAL FIELD

Embodiments of the disclosure relate to the field of microelectronic device design and fabrication. More specifically, embodiments of the disclosure relate to microelectronic devices including stadium structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize three-dimensional (3D) memory array architectures. A conventional 3D memory array includes vertical memory strings extending through openings in tiers of conductive structures (e.g., local word lines, local access lines) and insulative materials at each junction of the vertical memory strings and the conductive structures. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Conventional 3D memory arrays include electrical connections between the conductive structures of the tiers and control logic devices (e.g., string drivers, word line drivers, access line drivers) within a base structure so that memory cells in the 3D memory array can be uniquely selected for writing, reading, or erasing operations. One method of forming such an electrical connection includes forming at least one so-called "staircase" (or "stair step") structure at edges (e.g., horizontal ends) of the tiers. The staircase structure includes individual "steps" defining contact regions of the conductive structures. An assembly of the control logic devices may be provided in electrical communication with the steps of the staircase structure and, hence, the conductive structures and the memory cells of the 3D memory array, by way of routing and interconnect structures.

However, as the number of memory cells in a 3D memory array has increased, electrically connecting the memory cells of the 3D memory array to the assembly of control logic devices within the base structure has created sizing and spacing complications associated with the increased quantities and dimensions of routing and interconnect structures required to facilitate the electrical connection. In addition, the quantities, dimensions, and arrangements of different control logic devices employed within the base structure can also undesirably impede reductions to the size of a 3D memory array, increases to the storage density of the 3D memory array, and/or reductions in fabrication costs.

BRIEF DESCRIPTION OF THE DRAWINGS

FIG. 6 is a schematic block diagram illustrating an electronic system, in accordance with embodiments of the disclosure.

DETAILED DESCRIPTION

Figure 1:
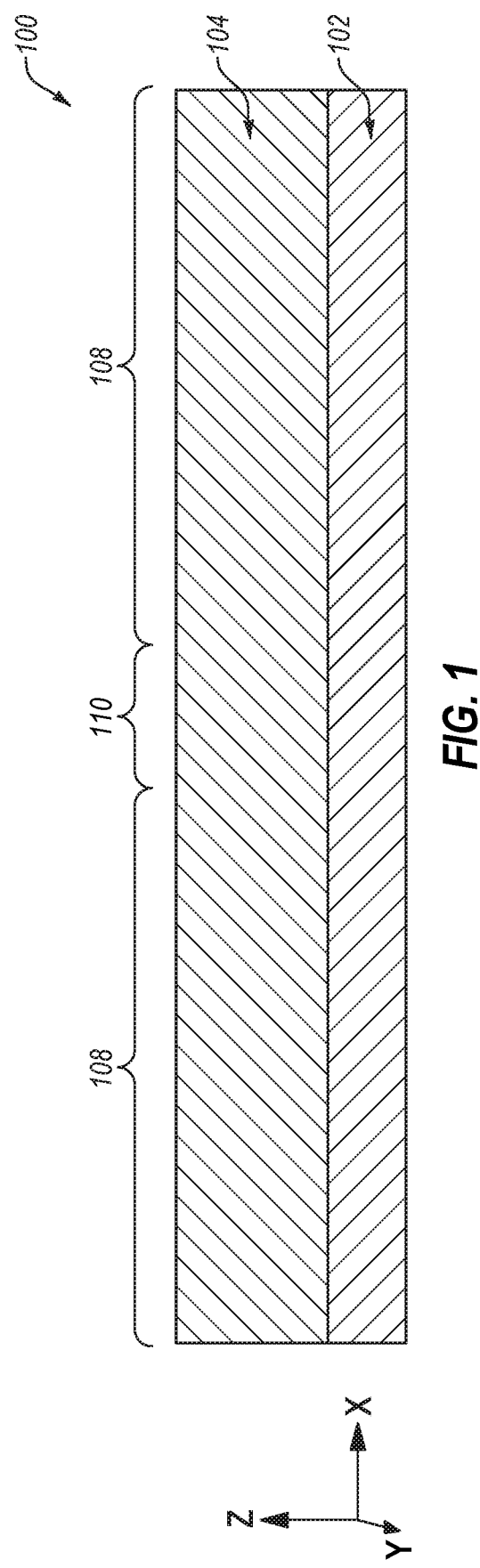
FIG. 1 is a simplified side elevation schematic view of an apparatus, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the term "electrically conductive material" means and includes a material including one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)); at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel); at least one conductively doped semiconductor material (e.g., conductively doped polysilicon, conductively doped germanium (Ge), conductively doped silicon germanium (SiGe)); and at least one conductive metal-containing material (e.g., a conductive metal nitride, such as one or more of titanium nitride (TiN), tantalum nitride (TaN), tungsten nitride (WN), and titanium aluminum nitride (TiAlN); conductive metal silicide; a conductive metal carbide; a conductive metal oxide, such as one or more of iridium oxide (IrO) and ruthenium oxide (RuO)). In addition, a "conductive structure" means and includes a structure formed of and including electrically conductive material.

As used herein, the term "electrically insulative material" means and includes at least one dielectric material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride (SiOxCzNy)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the dielectric material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including electrically insulative material.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIG. 1 shows a simplified side elevation schematic view of a microelectronic device 100 (e.g., a 3D memory device, such as a 3D NAND Flash memory device), in accordance with embodiments of the disclosure. As shown in FIG. 1, the microelectronic device 100 includes a base structure 102, and a memory structure 104 overlying the base structure 102. As shown in FIG. 1, the microelectronic device 100 may include at least two memory array regions 108, and at least one contact region 110 horizontally interposed (e.g., in the X-direction) between the at least two memory array regions 108. Components (e.g., features, structures, devices) of the microelectronic device 100 (including components of the base structure 102 and the memory structure 104) within different regions thereof (e.g., the memory array regions 108, the contact region 110) are described in further detail below with reference to FIGS. 2, 3A through 3B, 4A through 4C, and 5A through 5C.

Figure 2:
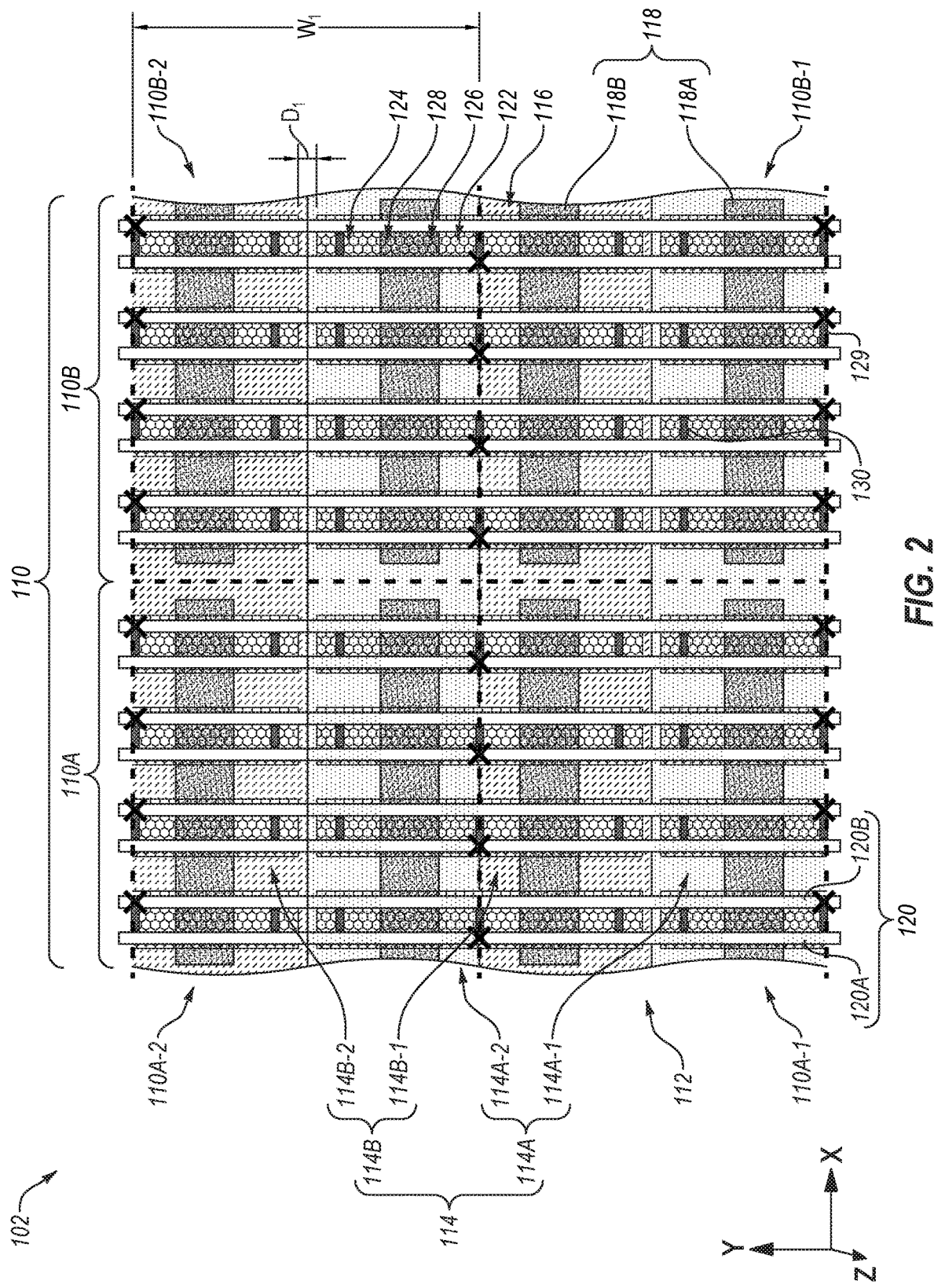
FIG. 2 is simplified partial plan view of a base structure of the microelectronic device shown in FIG. 1, in accordance with embodiments of the disclosure.

FIG. 2 illustrates a simplified, partial plan view of the base structure 102 of the microelectronic device 100 shown in FIG. 1 within horizontal boundaries (e.g., in the X-direction and the Y-direction) of the contact region 110 of the microelectronic device 100. As shown in FIG. 2, within horizontal boundaries of the contact region 110, the base structure 102 includes string driver circuitry 112 (e.g., access line driver circuitry, word line driver circuitry) operatively associated with blocks 114 of the memory structure 104 (FIG. 1) overlying the base structure 102. The blocks 114 include a horizontally alternating (e.g., in the Y-direction) sequence of even blocks 114A and odd blocks 114B. The string driver circuitry 112 includes string driver transistors 116 (e.g., pass transistors, access transistors) arranged in rows horizontally extending in the X-direction, and columns horizontally extending in the Y-direction orthogonal to the X-direction. In addition, the base structure 102 further includes block select lines 118 (e.g., block enable lines) coupled to the string driver transistors 116 and horizontally extending in the X-direction; and global word lines 120 (e.g., global access lines) coupled to the string driver transistors 116 and horizontally extending in the Y-direction.

As shown in FIG. 2, the contact region 110 may be divided into a first section 110A, and a second section 110B horizontally neighboring (e.g., in the X-direction) the first section 110A. The first section 110A and the second section 110B may have substantially the same horizontal dimensions as one another. As described in further detail below, groups of the string driver transistors 116 within the first section 110A may be employed to electrically connect (e.g., select, couple) and electrically disconnect (e.g., deselect, uncouple) local word lines (e.g., local access lines) of even blocks 114A of the memory structure 104 (FIG. 1) with some of the global word lines 120; and additional groups of the string driver transistors 116 within the second section 110B may be employed to electrically connect (e.g., select, couple) and electrically disconnect (e.g., deselect, uncouple) local word lines of the odd blocks 114B of the memory structure 104 (FIG. 1) with some other of the global word lines 120.

The block select lines 118 may include even block select lines 118A vertically underlying and within horizontal boundaries of the even blocks 114A of the memory structure 104 (FIG. 1), and odd block select lines 118B vertically underlying and within horizontal boundaries of the odd blocks 114B of the memory structure 104 (FIG. 1). The block select lines 118 may be formed of and include electrically conductive material, and may be coupled to gates of the string driver transistors 116. As shown in FIG. 2, some of the block select lines 118 may horizontally terminate (e.g., horizontally end) in the X-direction within the first section 110A of the contact region 110, and other of the block select lines 118 may horizontally terminate (e.g., horizontally end) in the X-direction within the second section 110B of the contact region 110. As described in further detail below, pairs of the block select lines 118 may be employed to select individual blocks 114 of the memory structure 104 (FIG. 1). Within the first section 110A of the contact region 110, pairs of the block select lines 118 individually including an even block select line 118A and an odd block select line 118B horizontally neighboring (e.g., in the Y-direction) the even block select line 118A may be employed to select the even blocks 114A of the memory structure 104 (FIG. 1). Within the second section 110B of the contact region 110, additional pairs of the block select lines 118 individually including an even block select line 118A and an odd block select line 118B horizontally neighboring (e.g., in the Y-direction) the even block select line 118A may be employed to select the odd blocks 114B of the memory structure 104 (FIG. 1).

With continued reference to FIG. 2, the string driver transistors 116 may each individually include a source region 122, a drain region 124, a channel region 126 horizontally interposed (e.g., in the Y-direction) between the source region 122 and the drain region 124, and a gate 128 overlying the channel region 126. The channel region 126 may be formed of and include semiconductive material (e.g., polycrystalline silicon), and the source region 122 and the drain region 124 may be formed of and include semiconductive material doped with at least one dopant (e.g., at least one N-type dopant, such as one or more of phosphorus, arsenic, antimony, and bismuth; at least one P-type dopant, such as one or more of boron, aluminum, and gallium). A single (e.g., only one) source region 122 may be shared by two (2) horizontally neighboring (e.g., in the Y-direction) string driver transistors 116. Global contact structures 129 formed of and including electrically conductive material may be coupled to the source regions 122 of the string driver transistors 116; and local contact structures 130 formed of and including electrically conductive material may be coupled to the drain regions 124 of the string driver transistors 116. The global contact structures 129 may also be coupled to the global word lines 120, and the local contact structures 130 may also be coupled to local word lines of the blocks 114 of the memory structure 104 (FIG. 1), as described in further detail below. In addition, the gates 128 of the string driver transistors 116 may be coupled to the block select lines 118. The gates 128 may comprise sections (e.g., portions, regions) of the block select lines 118. The block select lines 118 may horizontally extend (e.g., in the X-direction) between and be shared by multiple string driver transistors 116.

As shown in FIG. 2, the string driver circuitry 112 may include rows of the string driver transistors 116 horizontally extending in the X-direction, and columns of the string driver transistors 116 horizontally extending in the Y-direction orthogonal to the X-direction. Each column of the string driver transistors 116 may include a pair (e.g., two) of the global word lines 120 operatively associated therewith. Each pair of the global word lines 120 may individually include a first global word line 120A, and a second global word line 120B horizontally neighboring (e.g., in the X-direction) the first global word line 120A. As shown in FIG. 2, the first global word line 120A and the second global word line 120B operatively associated with an individual column of the string driver transistors 116 may be coupled to different global contact structures 129 than one another. In FIG. 2, connections between global word lines 120 (e.g., first global word lines 120A, second global word lines 120B) and global contact structures 129 are identified with an "x" symbol. In addition, for each column of the string driver transistors 116, horizontally neighboring (e.g., in the Y-direction) string driver transistors 116 that do not share a source region 122 with one another may be separated (e.g., spaced apart) from one another by a distance Di less than or equal to about 1.0 micrometer (μm), such as less than or equal to about 0.75 μm, less than or equal to about 0.60 μm, less than or equal to about 0.50 μm, less than or equal to about 0.40 μm, less than or equal to about 0.30 μm, within a range of from about 0.30 μm to about 1.0 μm, within a range of from about 0.30 μm to about 0.75 μm, within a range of from about 0.30 μm to about 0.60 μm, within a range of from about 0.30 μm to about 0.50 μm, within a range of from about 0.30 μm to about 0.40 μm, within a range of from about 0.40 μm to about 1.0 μm, within a range of from about 0.40 μm to about 0.75 μm, within a range of from about 0.40 μm to about 0.60 μm, within a range of from about 0.40 μm to about 0.50 μm, within a range of from about 0.50 μm to about 1.0 μm, within a range of from about 0.50 μm to about 0.75 μm, or within a range of from about 0.50 μm to about 0.6 μm.

With continued reference to FIG. 2, each block 114 of the memory structure 104 (FIG. 1) may individually have two (2) horizontally neighboring rows of the string driver transistors 116 operatively associated therewith (e.g., coupled to local word lines thereof). For each block 114, two (2) horizontally neighboring rows of the string driver transistors 116 may be in electrical communication with local word lines of the block 114 by way of electrically conductive routing structures (e.g., horizontally extending conductive routing structures, vertically extending conductive routing structures) coupled to and extending between the local contact structures 130 associated with the two (2) horizontally neighboring rows of the string driver transistors 116 and the local word lines of the block 114. Within the first section 110A of the contact region 110, each even block 114A of the memory structure 104 (FIG. 1) may individually be in electrical communication with two (2) horizontally neighboring rows of the string driver transistors 116. Within the second section 110B of the contact region 110, each odd block 114B of the memory structure 104 (FIG. 1) may individually be in electrical communication with two (2) horizontally neighboring rows of the string driver transistors 116.

As shown in FIG. 2, two (2) horizontally neighboring rows of the string driver transistors 116 may be substantially horizontally confined within a horizontal width Wi in the Y-direction of two (2) horizontally neighboring blocks 114 (e.g., an even block 114A and an odd block 114B horizontally neighboring the even block 114A) of the memory structure 104 (FIG. 1). A pitch in the Y-direction of the two (2) horizontally neighboring rows of the string driver transistors 116 may be substantially the same as a pitch in the Y-direction two (2) horizontally neighboring blocks 114 of the memory structure 104 (FIG. 1).

In view of the configurations of the string driver transistors 116, the block select lines 118, and the global word lines 120 within the contact region 110, the first section 110A and the second section 110B of the contact region 110 may be further sub-divided in the Y-direction at least partially based on block selection facilitated by different horizontally neighboring (e.g., in the Y-direction) rows of the string driver transistors 116. In FIG. 2 different sub-sections are identified by dashed lines. For example, as shown in FIG. 2, the first section 110A of the contact region 110 may be sub-divided into a first sub-section 110A-1 and a second sub-section 110A-2. Within the first sub-section 110A-1 of the first section 110A, two (2) horizontally neighboring (e.g., in the Y-direction) rows of the string driver transistors 116 (and, hence, two (2) horizontally neighboring block select lines 118) may be operatively associated with a first even block 114A-1 of the memory structure 104 (FIG. 1). Within the second sub-section 110A-2 of the first section 110A, two (2) other horizontally neighboring (e.g., in the Y-direction) rows of the string driver transistors 116 (and, hence, two (2) other horizontally neighboring block select lines 118) may be operatively associated with a second even block 114A-2 of the memory structure 104 (FIG. 1). In addition, as also shown in FIG. 2, the second section 110B of the contact region 110 may, for example, be sub-divided into a first additional sub-section 110B-1 and a second additional sub-section 110B-2. Within the first additional sub-section 110B-1 of the second section 110B, two (2) horizontally neighboring (e.g., in the Y-direction) rows of the string driver transistors 116 (and, hence, two (2) horizontally neighboring block select lines 118) may be operatively associated with a first odd block 114B-1 of the memory structure 104 (FIG. 1). Within the second additional sub-section 110B-2 of the second section 110B, two (2) other horizontally neighboring (e.g., in the Y-direction) rows of the string driver transistors 116 (and, hence, two (2) other horizontally neighboring block select lines 118) may be operatively associated with a second odd block 114B-2 of the memory structure 104 (FIG. 1).

While FIG. 2 depicts the contact region 110 as including four (4) sub-sections (e.g., the first sub-section 110A-1 and the second sub-section 110A-2 of the first section 110A; and the first additional sub-section 110B-1 and the second additional sub-section 110B-2 of the second section 110B) associated with four (4) blocks 114 of the memory structure 104 (FIG. 1), the contact region 110 is not so limited. For example, the memory structure 104 (FIG. 1) may include greater than four (4) of the blocks 114 (e.g., greater than or equal to eight (8) blocks 114, greater than or equal to sixteen (16) blocks 114, greater than or equal to thirty-two (32) blocks 114), and, hence, the contact region 110 may include greater than four (4) sub-sections. If, by way of non-limiting example, the memory structure 104 is formed to include thirty-two (32) of the blocks 114, the contact region 110 may include thirty-two (32) sub-sections. In such embodiments, the first section 110A of the contact region 110 may include sixteen (16) sub-sections, and the second section 110B of the contact region 110 may include sixteen (16) additional sub-sections. Each sub-section of the contact region 110 may individually include two (2) horizontally neighboring (e.g., in the Y-direction) rows of the string driver transistors 116 (and, hence, two (2) horizontally neighboring block select lines 118) operatively associated with a single (e.g., only one) block 114 of the memory structure 104 (FIG. 1).

With continued reference to FIG. 2, during use and operation of the microelectronic device 100 (FIG. 1), a pair of the block select lines 118 (e.g., an even block select line 118A and an odd block select line 118B) may be enabled (e.g., activated) to select two (2) rows of the string driver transistors 116 operatively associated with an individual block 114 of the memory structure 104 (FIG. 1). Selecting the two (2) rows of the string driver transistors 116 electrically connects a group of the global word lines 120 coupled to the string driver transistors 116 of the two (2) rows to local word lines of the block 114 coupled to the string driver transistors 116 of the two (2) rows. A voltage may be applied to at least one pair of global word lines 120 (e.g., a first global word line 120A and a second global word line 120B operatively associated with an individual column of the string driver transistors 116) of the group of the global word lines 120 to drive at least one local word line coupled to at least one of the string driver transistors 116 of a first of the two (2) rows of the string driver transistors 116 and also bias at least other, horizontally neighboring (e.g., in the Y-direction) string driver transistors 116 of a second of the two (2) rows of the string driver transistors 116. Biasing the other, horizontally neighboring string driver transistor 116 of the second row may reduce electrical field potential between the string driver transistor 116 of the first row and the other, horizontally neighboring string driver transistor 116 of the second row. In addition, as the pair of the block select lines 118 are enabled, other pairs of the block select lines 118 are disabled (e.g., deactivated) to deselect other rows of the string driver transistors 116 operatively associated with the other blocks 114 of the memory structure 104 (FIG. 1).

Figure 3A:
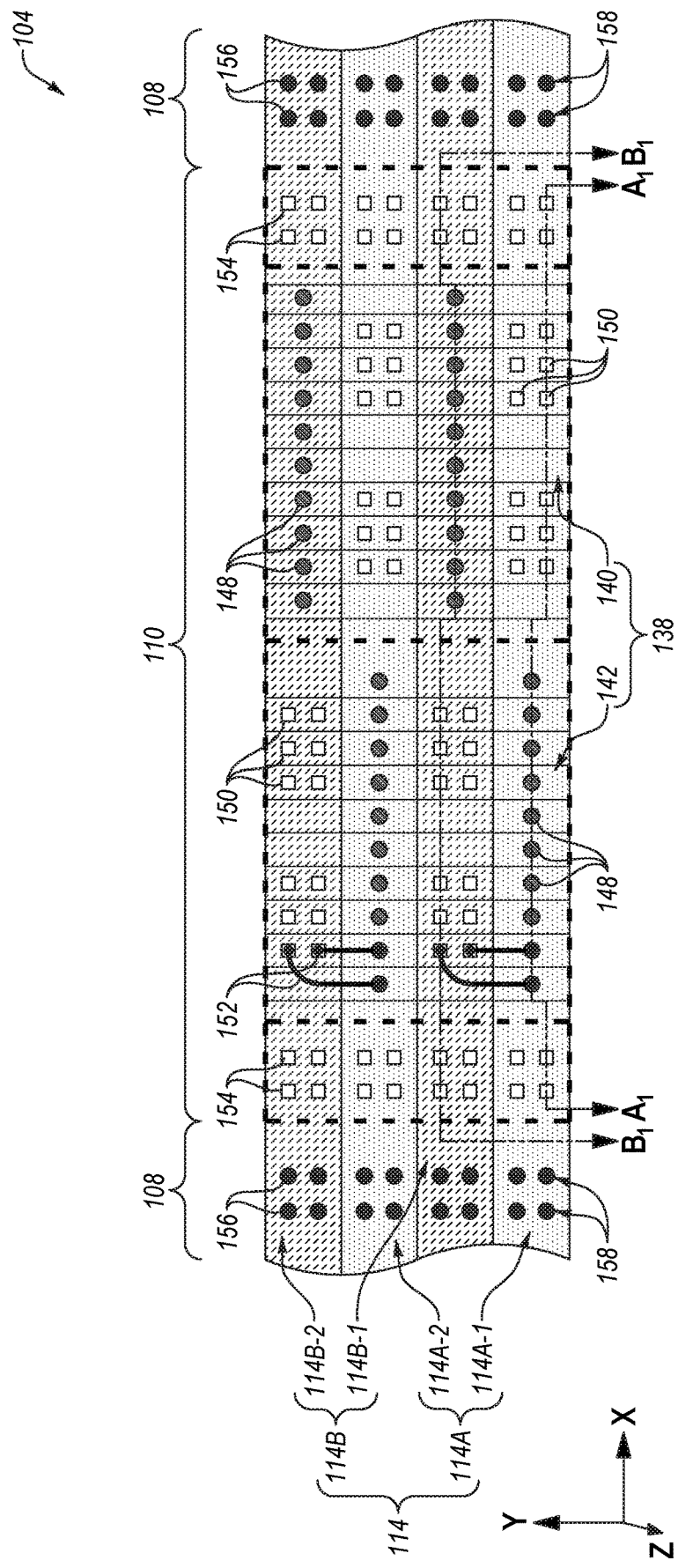
FIG. 3A is a simplified partial plan view of a memory structure of the microelectronic device shown in FIG. 1, in accordance with embodiments of the disclosure.
Figure 3B:
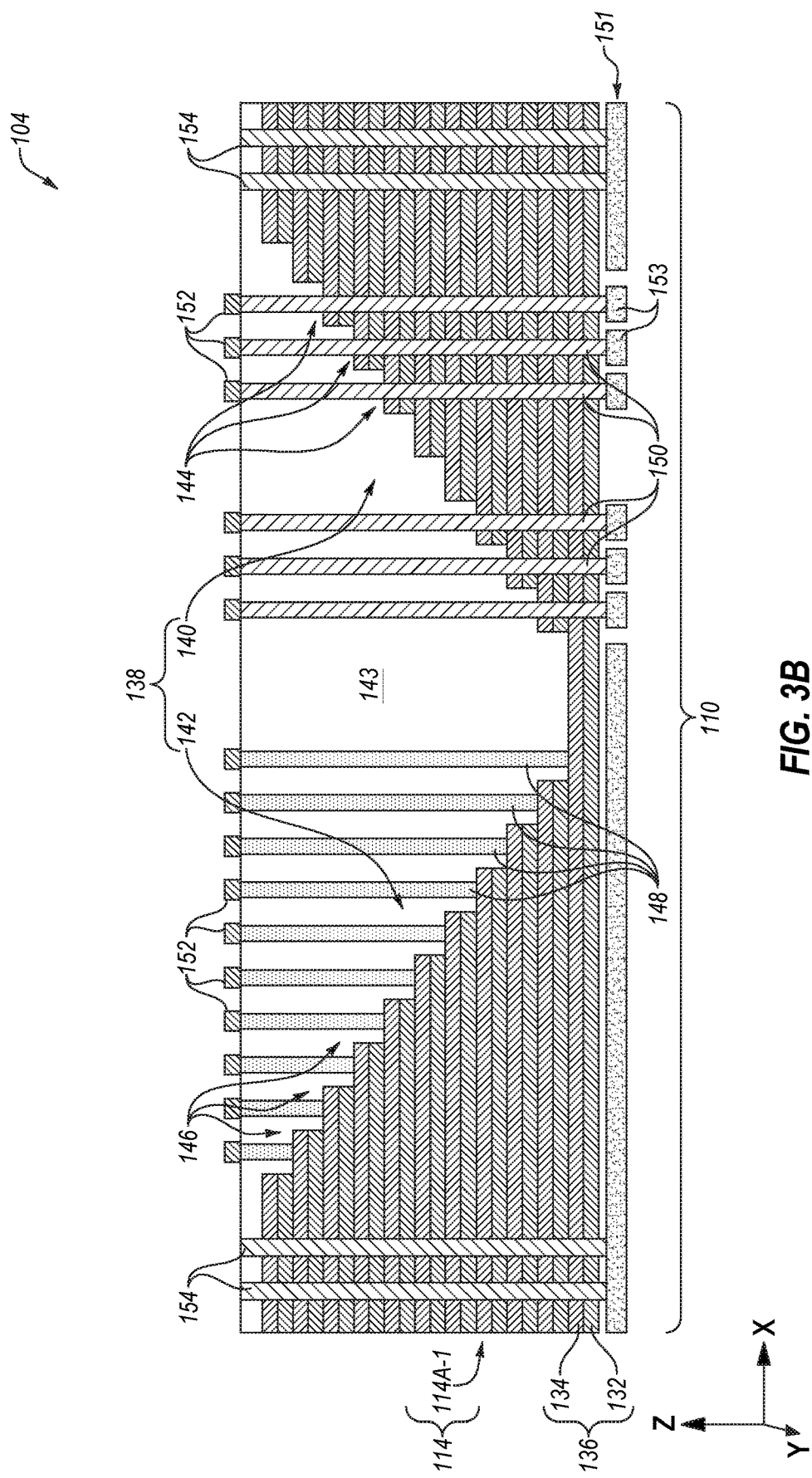
FIG. 3B is a simplified partial cross-sectional view of the memory structure shown in FIG. 3A about the line $A_1$-$A_1$ shown in FIG. 3A.
Figure 3C:
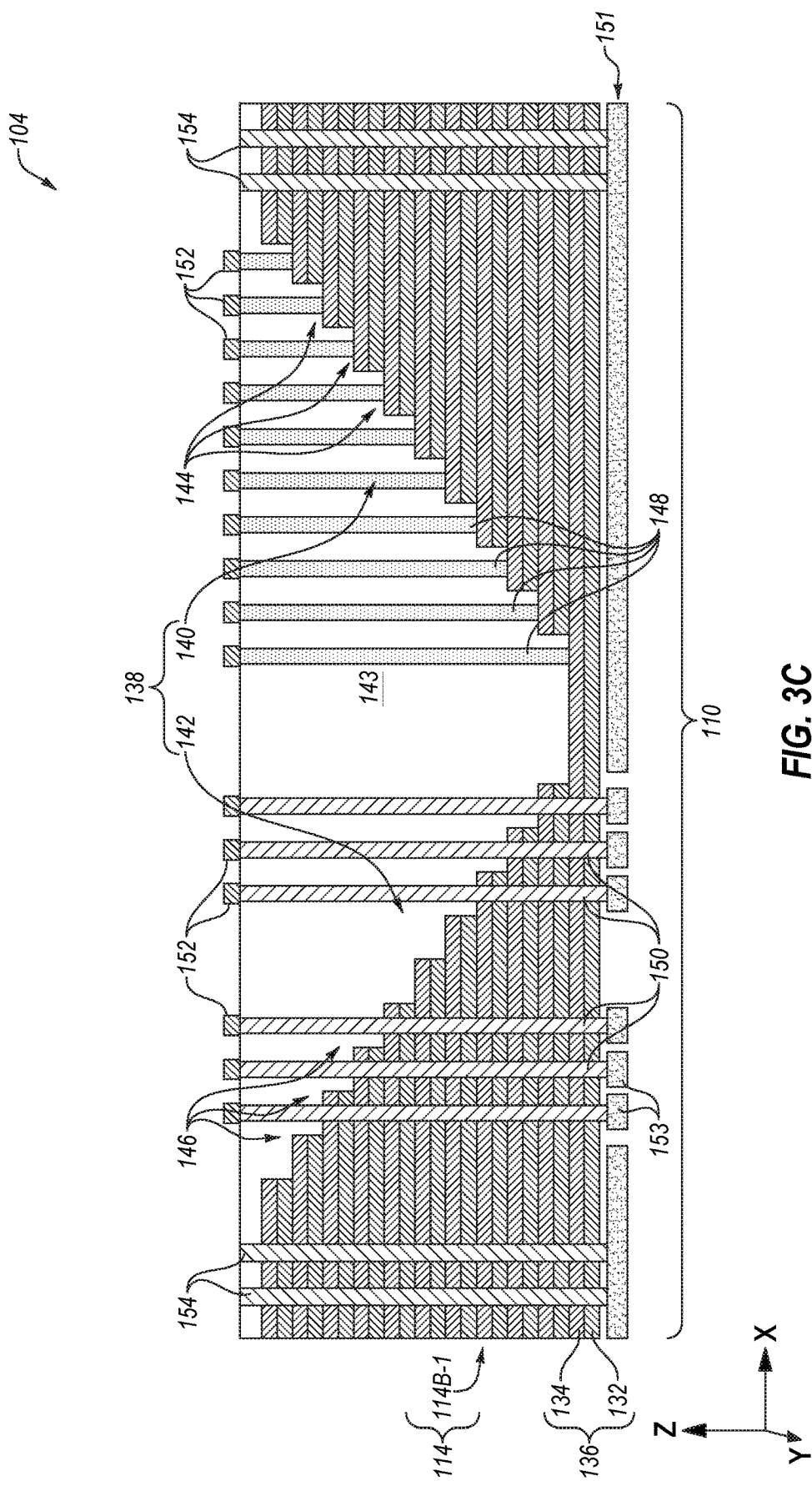
FIG. 3C is a simplified partial cross-sectional view of the memory structure shown in FIG. 3A about the line $B_1$-$B_1$ shown in FIG. 3A.

Referring next to FIG. 3A, illustrated is a simplified, partial plan view of the memory structure 104 of the microelectronic device 100 shown in FIG. 1. FIG. 3A shows the blocks 114 (including the even blocks 114A and the odd blocks 114B) of the memory structure 104 previously described with reference to FIG. 2, as well as features (e.g., structures) on, over, and/or within the blocks 114 that are described in further detail below. FIG. 3B illustrates a simplified, partial cross-sectional view of the memory structure 104 about the line $A_1$-$A_1$ depicted in FIG. 3A. FIG. 3C illustrates a simplified, partial cross-sectional view of the memory structure 104 about the line $B_1$-$B_1$ depicted in FIG. 3A.

Referring to FIG. 3B, each of the blocks 114 of the memory structure 104 may individually include a vertically alternating (e.g., in the Z-direction) sequence of insulative structures 132 and conductive structures 134 arranged in tiers 136. Each of the tiers 136 may individually include at least one of the conductive structures 134 vertically neighboring at least one of the insulative structures 132. Each block 114 may include a desired quantity of the tiers 136. For example, each block 114 may include greater than or equal to eight (8) of the tiers 136, greater than or equal to sixteen (16) of the tiers 136, greater than or equal to thirty-two (32) of the tiers 136, greater than or equal to sixty-four (64) of the tiers 136, greater than or equal to one hundred and twenty-eight (128) of the tiers 136, or greater than or equal to two hundred and fifty-six (256) of the tiers 136 of the insulative structures 132 and conductive structures 134.

The insulative structures 132 of the tiers 136 of each block 114 may be formed of and include at least one electrically insulative material. In some embodiments, the insulative structures 132 are formed of and include silicon dioxide ($SiO_2$). Each of the insulative structures 132 may individually be substantially homogeneous, or one or more of the insulative structures 246 may individually be substantially heterogeneous. As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. In some embodiments, each of the insulative structures is substantially homogeneous. In additional embodiments, at least one (e.g., each) of the insulative structures 132 is heterogeneous. An individual insulative structure 132 may, for example, be formed of and include a stack of at least two different dielectric materials. The insulative structures 132 of each of the tiers 136 may each be substantially planar, and may each individually exhibit a desired thickness.

The conductive structures 134 of the tiers 136 of each block 114 may be formed of and include at least one electrically conductive material. The conductive structures 134 of each block 114 may serve as local word lines (e.g., local access lines) for the block 114. In some embodiments, the conductive structures 134 are formed of and include a metallic material (e.g., a metal, such as W; an alloy). In additional embodiments, the conductive structures 134 are formed of and include conductively doped polycrystalline silicon. Each of the conductive structures 134 may individually be substantially homogeneous, or one or more of the conductive structures 134 may individually be substantially heterogeneous. In some embodiments, each of the conductive structures 134 is substantially homogeneous. In additional embodiments, at least one (e.g., each) of the conductive structures 134 is heterogeneous. An individual conductive structure 134 may, for example, be formed of and include a stack of at least two different electrically conductive materials. The conductive structures 134 of each of the tiers 136 may each be substantially planar, and may each exhibit a desired thickness.

At least one lower conductive structure 134 of an individual block 114 of the memory structure 104 may be employed as at least one lower select gate (e.g., at least one source side select gate (SGS)) for lower select transistors (e.g., source side select transistors) of the block 114. In some embodiments, a single (e.g., only one) conductive structure 134 of a vertically lowermost tier 136 of a block 114 is employed as a lower select gate (e.g., a SGS). In addition, upper conductive structure(s) 134 of an individual block 114 of the memory structure 104 may be employed as upper select gate(s) (e.g., drain side select gate(s) (SGDs)) for upper select transistors (e.g., drain side select transistors) of the block 114. In some embodiments, horizontally neighboring (e.g., in the Y-direction) conductive structures 134 of a vertically uppermost tier 136 of a block 114 are employed as upper select gates (e.g., SGDs).

Still referring to FIG. 3B, within horizontal boundaries of the contact region 110 of the microelectronic device 100 (FIG. 1), individual blocks 114 of the memory structure 104 include at least one stadium structure 138. As shown in FIG. 3B, each stadium structure 138 may individually include a forward staircase structure 140 including steps 144 comprising horizontal ends (e.g., edges) of at least some of the tiers 136 of the block 114, and a reverse staircase structure 142 including additional steps 146 comprising additional horizontal ends (e.g., additional edges) of at least some the tiers 136 of the block 114. A phantom line extending from a top of the forward staircase structure 140 to a bottom of the forward staircase structure 140 may have a positive slope, and another phantom line extending from a top of the reverse staircase structure 142 to a bottom of the reverse staircase structure 142 may have a negative slope. In some embodiments, the reverse staircase structure 142 mirrors the forward staircase structure 140. In additional embodiments, one or more of the blocks 114 may exhibit a different configuration of a stadium structure 138 thereof. As a non-limiting example, at least one stadium structure 138 may be modified to include a forward staircase structure 140 but not a reverse staircase structure 142 (e.g., the reverse staircase structure 142 may be absent). As another non-limiting example, at least one stadium structures 138 may be modified to include a reverse staircase structure 142 but not a forward staircase structure 140 (e.g., the forward staircase structure 140 may be absent).

Each stadium structure 138 may individually include a desired quantity of the steps 144 and the additional steps 146 thereof. By way of non-limiting example, each stadium structure 138 may include greater than or equal to twenty (20) of the steps 144, and greater than or equal to twenty (20) of the additional steps 146. The quantity of the steps 144 included in the forward staircase structure 140 may substantially the same as or may be different the quantity of additional steps 146 included in the reverse staircase structure 142. In some embodiments, the quantity of the steps 144 included in the forward staircase structure 140 is the same as the quantity of additional steps 146 included in the reverse staircase structure 142.

As shown in FIG. 3B, trenches (e.g., openings) within the blocks 114 at least partially defined by the stadium structures 138 may be filled with an isolation material 143. The isolation material 143 may substantially cover and extend between the forward staircase structure 140 and the reverse staircase structure 142 of individual stadium structures 138. The isolation material 143 may be formed of and include at least one electrically insulative material. In some embodiments, the isolation material 143 is formed of and includes $SiO_2$.

With returned reference to FIG. 3A, the memory structure 104 includes conductive contact structures 148 (e.g., local word line contact structures, local access line contact structures) and conductively filled vias 150 (e.g., conductively filled TAVs) within horizontal boundaries of the contact region 110. As shown in FIG. 3A, the conductive contact structures 148 and the conductively filled vias 150 may be located within horizontal boundaries (e.g., in the X-direction, in the Y-direction) of the stadium structures 138 of the blocks 114 of the memory structure 104. For an individual stadium structure 138 of an individual block 114, the conductive contact structures 148 may be positioned within horizontal boundaries of one of the forward staircase structure 140 and the reverse staircase structure 142 of the stadium structure 138, and the conductively filled vias 150 may be positioned within horizontal boundaries of the other of the forward staircase structure 140 and the reverse staircase structure 142 of the stadium structure 138. In addition, the locations of the conductive contact structures 148 and the conductively filled vias 150 within the stadium structures 138 of the even blocks 114A of the memory structure 104 are different than (e.g., switched from) the locations of the conductive contact structures 148 and the conductively filled vias 150 within the stadium structures 138 of the odd blocks 114B of the memory structure 104. The conductive contact structures 148 may be formed of and include at least one electrically conductive material, and the conductively filled vias 150 may be filled with at least one electrically conductive material.

In some embodiments, for the even blocks 114A, the conductive contact structures 148 are horizontally confined within horizontal boundaries of the reverse staircase structures 142, and the conductively filled vias 150 are horizontally confined within horizontal boundaries of the forward staircase structures 140; and for the odd blocks 114B, the conductive contact structures 148 are horizontally confined within horizontal boundaries of the forward staircase structures 140, and the conductively filled vias 150 are horizontally confined within horizontal boundaries of the reverse staircase structures 142. In additional embodiments, for the even blocks 114A, the conductive contact structures 148 are horizontally confined within horizontal boundaries of the forward staircase structures 140, and the conductively filled vias 150 are horizontally confined within horizontal boundaries of the reverse staircase structures 142; and for the odd blocks 114B, the conductive contact structures 148 are horizontally confined within horizontal boundaries of the reverse staircase structures 142, and the conductively filled vias 150 are horizontally confined within horizontal boundaries of the forward staircase structures 140.

Referring to FIG. 3B, for an individual even block 114A (e.g., the first even block 114A-1) of the memory structure 104, the conductive contact structures 148 may be coupled to at least some of the conductive structures 134 of the tiers 136 of the even block 114A at the additional steps 146 of the reverse staircase structure 142 of the stadium structure 138. As shown in FIG. 3B, the conductive contact structures 148 may vertically extend (e.g., in the Z-direction) through the isolation material 143, and may physically contact (e.g., land on) at least some of the conductive structures 134 of the even block 114A at the additional steps 146 of the reverse staircase structure 142. In additional embodiments, for an individual even block 114A (e.g., the first even block 114A-1) of the memory structure 104, the conductive contact structures 148 may be coupled to at least some of the conductive structures 134 of the tiers 136 of the even block 114A at the steps 144 of the forward staircase structure 140 of the stadium structure 138. The conductive contact structures 148 may vertically extend (e.g., in the Z-direction) through the isolation material 143, and may physically contact (e.g., land on) at least some of the conductive structures 134 of the even block 114A at the steps 144 of the forward staircase structure 140.

With continued reference to FIG. 3B, for an individual even block 114A (e.g., the first even block 114A-1) of the memory structure 104, the conductively filled vias 150 may vertically extend (e.g., in the Z-direction) through portions of the isolation material 143 and the tiers 136 of the even block 114A within horizontal boundaries of the forward staircase structure 140 of the stadium structure 138. In additional embodiments, for an individual even block 114A (e.g., the first even block 114A-1) of the memory structure 104, the conductively filled vias 150 may vertically extend (e.g., in the Z-direction) through portions of the isolation material 143 and the tiers 136 of the even block 114A within horizontal boundaries of the reverse staircase structure 142 of the stadium structure 138. As shown in FIG. 3B, the conductively filled vias 150 may vertically extend to a conductive tier 151 (e.g., a source tier, a metallization tier) underlying the tiers 136 of the even block 114A. The conductively filled vias 150 may be coupled to a group of conductive structures 153 of the conductive tier 151. The conductive structures 153 of the group may be coupled to local contact structures 130 (FIG. 2) coupled to some of the string driver transistors 116 (FIG. 2) of the string driver circuitry 112 (FIG. 2) within the base structure 102 (FIGS. 1 and 2).

Referring to next to FIG. 3C, for an individual odd block 114B (e.g., the first odd block 114B-1) of the memory structure 104, the conductive contact structures 148 may be coupled to at least some of the conductive structures 134 of the tiers 136 of the even block 114A at the steps 144 of the forward staircase structure 140 of the stadium structure 138. As shown in FIG. 3C, the conductive contact structures 148 may vertically extend (e.g., in the Z-direction) through the isolation material 143, and may physically contact (e.g., land on) at least some of the conductive structures 134 of the odd block 114B at the steps 144 of the forward staircase structure 140. In additional embodiments, such as embodiments wherein conductive contact structures 148 within horizontal boundaries of an even block 114A (FIGS. 3A and 3B) horizontally neighboring the odd block 114B contact steps 144 of a forward staircase structure 140 of the even block 114A (FIGS. 3A and 3B), conductive contact structures 148 within horizontal boundaries of the odd block 114B may be coupled to at least some of the conductive structures 134 of the tiers 136 of the odd block 114B at the additional steps 146 of the reverse staircase structure 142 of the odd block 114B. The conductive contact structures 148 may vertically extend (e.g., in the Z-direction) through the isolation material 143, and may physically contact (e.g., land on) at least some of the conductive structures 134 of the odd block 114B at the additional steps 146 of the reverse staircase structure 142.

With continued reference to FIG. 3C, for an individual odd block 114B (e.g., the first odd block 114B-1) of the memory structure 104, the conductively filled vias 150 may vertically extend (e.g., in the Z-direction) through portions of the isolation material 143 and the tiers 136 of the odd block 114B within horizontal boundaries of the reverse staircase structure 142 of the stadium structure 138. In additional embodiments, such as embodiments wherein conductively filled vias 150 within horizontal boundaries of an even block 114A (FIGS. 3A and 3B) horizontally neighboring the odd block 114B vertically extend through portions of the even block 114A within horizontal boundaries of the reverse staircase structure 142 of the even block 114A, the conductively filled vias 150 of the odd block 114B may vertically extend (e.g., in the Z-direction) through portions of the isolation material 143 and the tiers 136 of the odd block 114B within horizontal boundaries of the forward staircase structure 140 of the odd block 114B. As shown in FIG. 3C, the conductively filled vias 150 may vertically extend to the conductive tier 151 underlying the tiers 136 of the odd block 114B. The conductively filled vias 150 may be coupled to an additional group of the conductive structures 153 of the conductive tier 151. The conductive structures 153 of the additional group may be coupled to local contact structures 130 (FIG. 2) coupled to some other of the string driver transistors 116 (FIG. 2) of the string driver circuitry 112 (FIG. 2) within the base structure 102 (FIGS. 1 and 2).

In some embodiments, within an individual block 114 (e.g., an individual even block 114A, an individual odd block 114B) of the memory structure 104, conductively filled vias 150 are arranged in rows horizontally extending in the X-direction, and columns horizontally extending in Y-direction. For example, as shown in FIG. 3A, within an individual block 114 of the memory structure 104, conductively filled vias 150 may be arranged in two (2) rows horizontally extending in the X-direction. The conductively filled vias 150 may be substantially uniformly (e.g., evenly) horizontally spaced apart (e.g., in the X-direction) within each row, or may be at least partially non-uniformly (e.g., non-evenly) horizontally spaced apart (e.g., in the X-direction) within at least one row. In additional embodiments, one or more (e.g., each) of the blocks 114 may have a different arrangement of the conductively filled vias 150 relativities to one another than the arrangements shown in FIG. 3A. By way of non-limiting example, within an individual block 114 of the memory structure 104, conductively filled vias 150 may be arranged in a single (e.g., only one) row horizontally extending in the X-direction.

Referring collectively to FIGS. 2 and 3A, the conductively filled vias 150 (FIG. 3A) within the contact region 110 of the microelectronic device 100 (FIG. 1) may be coupled to the drain regions 124 (FIG. 2) of the string driver transistors 116 (FIG. 2) of the string driver circuitry 112 (FIG. 2) vertically underlying the memory structure 104 (FIG. 3A). For example, drain regions 124 of the string driver transistors 116 within the first sub-section 110A-1 of the first section 110A of the contact region 110 may be coupled to the conductively filled vias 150 vertically extending through the first odd block 114B-1. As another example, drain regions 124 of the string driver transistors 116 within the first additional sub-section 110B-1 of the second section 110B of the contact region 110 may be coupled to the conductively filled vias 150 vertically extending through the first even block 114A-1. As an additional example, drain regions 124 of string driver transistors 116 within the second sub-section 110A-2 of the first section 110A of the contact region 110 may be coupled to the conductively filled vias 150 vertically extending through the second odd block 114B-2. As a further example, drain regions 124 coupled to string driver transistors 116 within the second additional sub-section 110B-2 of the second section 110B of the contact region 110 may be coupled to the conductively filled vias 150 vertically extending through the second even block 114A-2. The conductively filled vias 150 within the contact region 110 of the microelectronic device 100 may be coupled to the drain regions 124 of the string driver transistors 116 of the string driver circuitry 112 by way of the conductive structures 153 (FIGS. 3B and 3C), the local contact structures 130 (FIG. 2), and, optionally, additional interconnect structures (e.g., additional routing structures) formed of and including electrically conductive material.

Referring to FIG. 3A, the conductively filled vias 150 within an individual even block 114A of the memory structure 104 may be coupled to the conductive contact structures 148 within an individual odd block 114B horizontally neighboring (e.g., in the Y-direction) the individual even block 114A by way of interconnect structures 152 (e.g., routing structures) formed of and including electrically conductive material, and vice versa. As a non-limiting example, as shown in FIG. 3A, the conductively filled vias 150 positioned within horizontal boundaries of the first odd block 114B-1 (e.g., within horizontal boundaries of the reverse staircase structure 142 thereof) may be coupled to the conductive contact structures 148 positioned within horizontal boundaries of the first even block 114A-1 (e.g., within horizontal boundaries of the reverse staircase structure 142 thereof) by way of a first group of the interconnect structures 152; and the conductively filled vias 150 positioned within horizontal boundaries of the first even block 114A-1 (e.g., within horizontal boundaries of the forward staircase structure 140 thereof) may be coupled to the conductive contact structures 148 positioned within horizontal boundaries of the first odd block 114B-1 (e.g., within horizontal boundaries of the forward staircase structure 140 thereof) by way of a second group of the interconnect structures 152. As another non-limiting example, the conductively filled vias 150 positioned within horizontal boundaries of the second odd block 114B-2 (e.g., within horizontal boundaries of the reverse staircase structure 142 thereof) may be coupled to the conductive contact structures 148 positioned within horizontal boundaries of the second even block 114A-2 (e.g., within horizontal boundaries of the reverse staircase structure 142 thereof) by way of a third group of the interconnect structures 152; and the conductively filled vias 150 positioned within horizontal boundaries of the second even block 114A-2 (e.g., within horizontal boundaries of the forward staircase structure 140 thereof) may be coupled to the conductive contact structures 148 positioned within horizontal boundaries of the second odd block 114B-2 (e.g., within horizontal boundaries of the forward staircase structure 140 thereof) by way of a fourth group of the interconnect structures 152. For ease and understanding of the drawings and related description only some of the interconnect structures 152 extending from and between the conductive contact structures 148 and the conductively filled vias 150 of horizontally neighboring blocks 114 are depicted in FIG. 3A. However, it will be understood that other of the conductive contact structures 148 may be coupled to other of the conductively filled vias 150 in the manner described above using other of the interconnect structures 152.

With continued reference to FIG. 3A, within the memory array region 108 of the microelectronic device 100 (FIG. 1) the blocks 114 of the memory structure 104 may individually include pillar structures 156 vertically extending through the block 114. Each of the pillar structures 156 may include a semiconductive pillar (e.g., a polycrystalline silicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the pillar structures 156 and the conductive structures 134 (FIGS. 3B and 3C) of the tiers 136 (FIGS. 3B and 3C) of the block 114 may define vertically extending strings of memory cells 158 coupled in series with one another within the memory array region 108 of the block 114 of the memory structure 104. In some embodiments, the memory cells 158 formed at the intersections of the conductive structures 134 (FIGS. 3B and 3C) and the pillar structures 156 within each the tiers 136 (FIGS. 3B and 3C) of the block 114 comprise so-called "MONOS" (metal-oxide-nitride-oxide-semiconductor) memory cells. In additional embodiments, the memory cells 158 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 158 comprise so-called "floating gate" memory cells including floating gates (e.g., metallic floating gates) as charge storage structures. The floating gates may horizontally intervene between central structures of the pillar structures 156 and the conductive structures 134 (FIGS. 3B and 3C) of the different tiers 136 (FIGS. 3B and 3C) of the block 114. The microelectronic device 100 may include any desired quantity and distribution of the pillar structures 156 within the memory array region 108 of the block 114.

With continued reference to FIG. 3A, the blocks 114 of the memory structure 104 may further include additional filled vias 154 (e.g., additional filled TAVs) horizontally interposed (e.g., in the X-direction) between the stadium structures 138 within the contact region 110 of the microelectronic device 100 (FIG. 1) and the pillar structures 156 within the memory array region 108 of the microelectronic device 100 (FIG. 1). As shown in FIGS. 3B and 3C, the additional filled vias 154 may vertically extend (e.g., in the Z-direction) through each of the tiers 136 of the blocks 114. The additional filled vias 154 may be filled with one or more of electrically conductive material, electrically insulative material, and semiconductive material. The additional filled vias 154 may, for example, be employed as one or more of conductive contact structures (e.g., select gate contact structures), support structures, and dummy structures for the blocks 114 of the memory structure 104.

Thus, a microelectronic device according to embodiments of the disclosure comprises blocks, conductive contact structures, conductively filled vias, and a base structure. The blocks each have a vertically alternating sequence of conductive structures and insulative structures arranged in tiers. Each of the blocks comprises a forward staircase structure having steps comprising edges of the tiers, and a reverse staircase structure opposing the forward staircase structure and having additional steps comprising additional edges of the tiers. The conductive contact structures are on the steps of the forward staircase structure of a first of the blocks and on the additional steps of the reverse staircase structure of a second of the blocks horizontally neighboring the first of the blocks in a first direction. The conductively filled vias vertically extend through portions of the first of the blocks within horizontal boundaries of the reverse staircase structure of the first of the blocks and vertically extend through portions of the second of the blocks within horizontal boundaries of the forward staircase structure of the second of the blocks. The base structure underlies the blocks and comprises transistors coupled to the conductively filled vias.

Furthermore, a memory device according to embodiments of the disclosure comprises a base structure having string driver circuitry, a memory structure overlying the base structure, first conductive routing structures, and second conductive routing structures. The string driver circuitry comprises pairs of even rows of string driver transistors, and pairs of odd rows of string driver transistors horizontally alternating with the pairs of the even rows of string driver transistors. The memory structure overlies the base structure and comprises blocks each having a vertically alternating sequence of conductive structures and insulative structures arranged in tiers. The blocks comprise even blocks vertically overlying the pairs of even rows of string driver transistors, and odd blocks vertically overlying the pairs of odd rows of string driver transistors and horizontally alternating with the even blocks. The first conductive routing structures couple the conductive structures of the even blocks with the string driver transistors of first even rows of the pairs of even rows of string driver transistors and with the string driver transistors of first odd rows of the pairs of odd rows of string driver transistors. The second conductive routing structures couple the conductive structures of the odd blocks with the string driver transistors of second even rows of the pairs of even rows of string driver transistors and with the string driver transistors of second odd rows of the pairs of odd rows of string driver transistors.

Moreover, 3D NAND Flash memory device according to embodiments of the disclosure comprises a memory structure, at least one stadium structure, conductive contact structures, additional conductive structures, vertically extending strings of memory cells, and a base structure. The memory structure comprises blocks each having tiers comprising a conductive structure and an insulative structure vertically neighboring the conductive structure. The at least one stadium structure is within a contact region of each block of the memory structure. The at least one stadium structure comprises opposing staircase structures each having steps comprising edges of the tiers of the block. The conductive contact structures are on the steps of a first of the opposing staircase structures of at least one of the blocks and on a second of the opposing staircase structures of at least one other of the blocks horizontally neighboring the at least one of the blocks. The additional conductive structures vertically extend through the at least one of the blocks at the steps of a second of the opposing staircase structures of the at least one of the blocks and vertically extend through the at least one other of the blocks at the steps of a first of the opposing staircase structures of the at least one other of the blocks. The vertically extending strings of memory cells are within memory array regions of each block of the memory structure. The base structure vertically underlies the memory structure and comprises string driver circuitry within horizontal boundaries of the contact region of each block of the memory structure. The string driver circuitry comprises rows of string driver transistors coupled to the additional conductive structures and to global word lines.

Figure 4A:
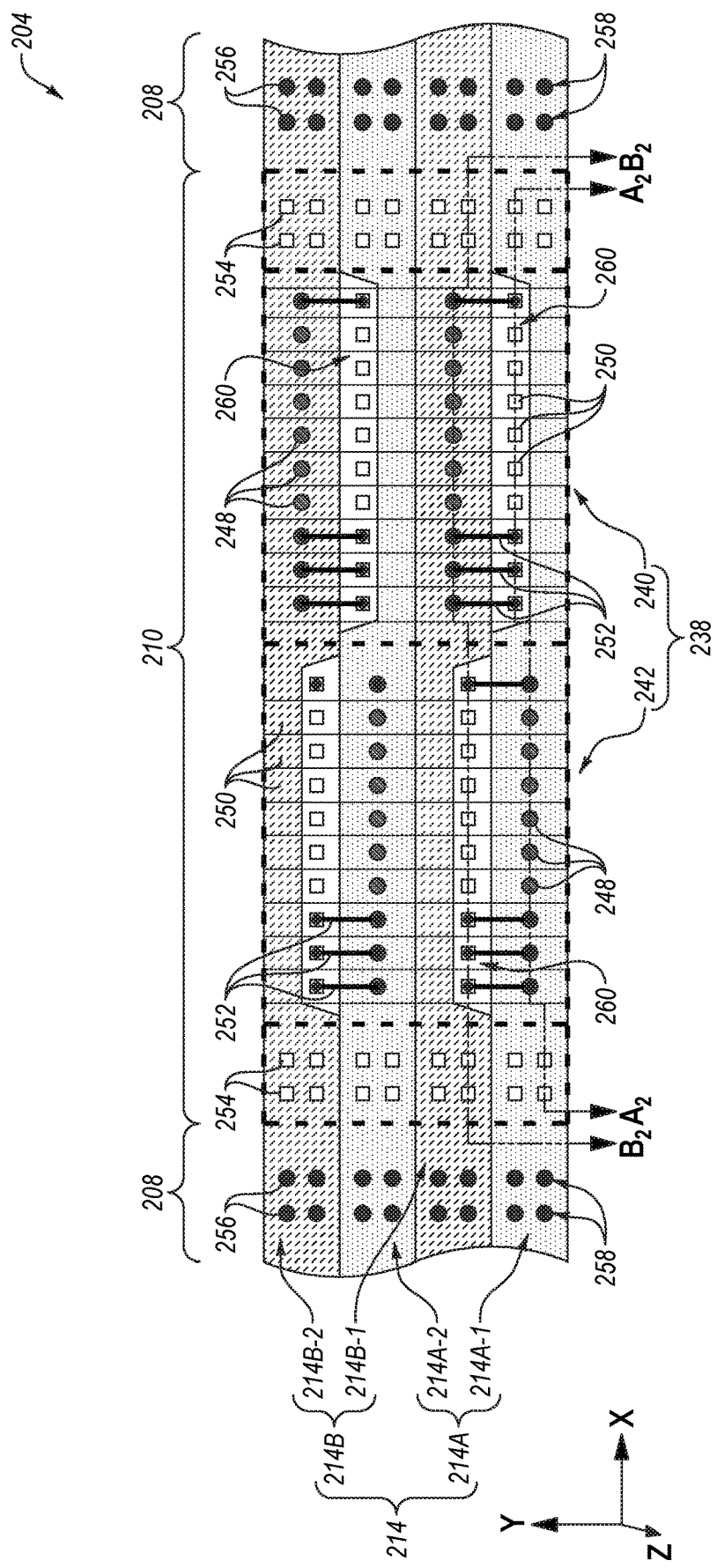
FIG. 4A is a simplified partial plan view of a memory structure for the microelectronic device shown in FIG. 1, in accordance with additional embodiments of the disclosure.
Figure 4B:
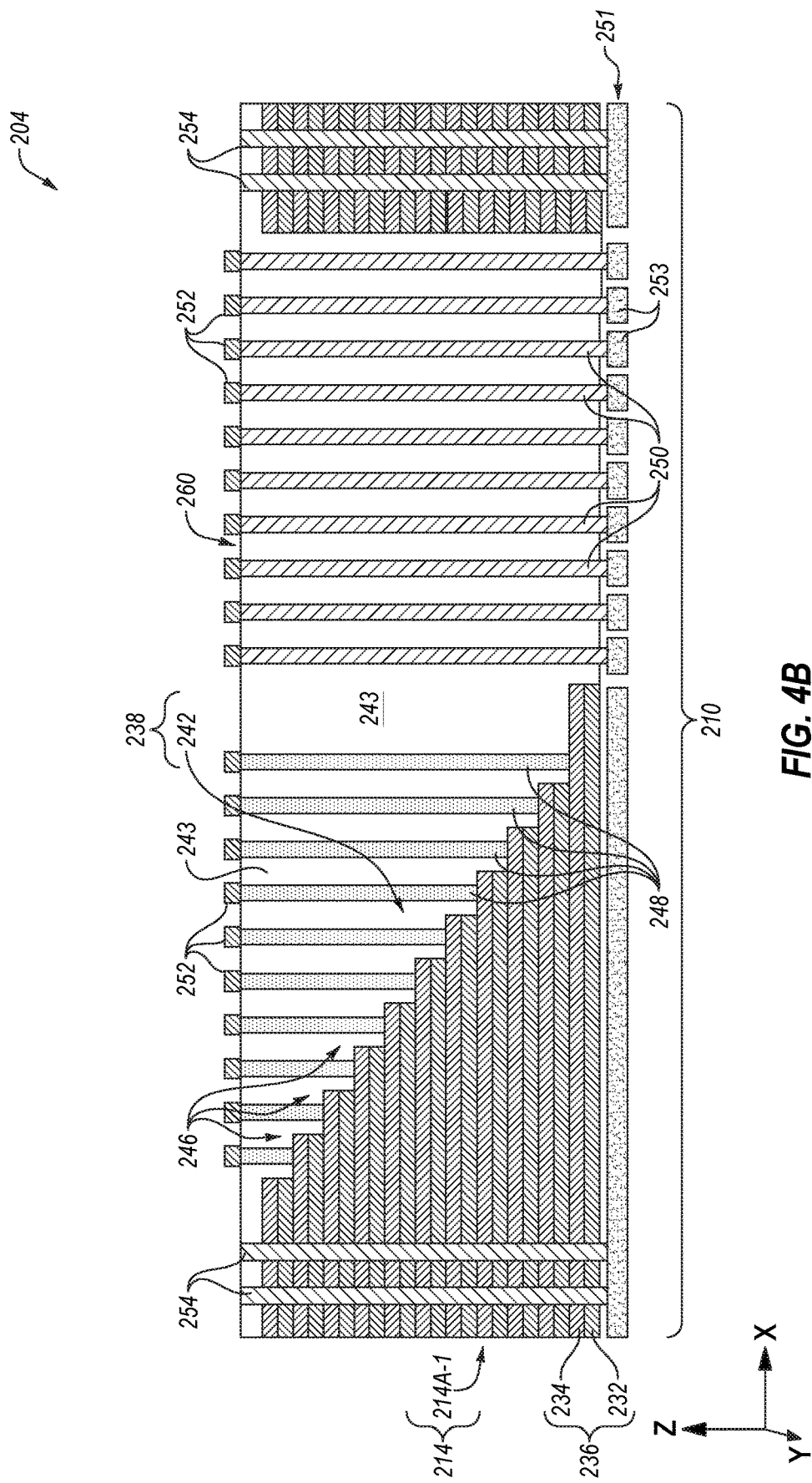
FIG. 4B is a simplified partial cross-sectional view of the memory structure shown in FIG. 4A about the line $A_2$-$A_2$ shown in FIG. 4A.
Figure 4C:
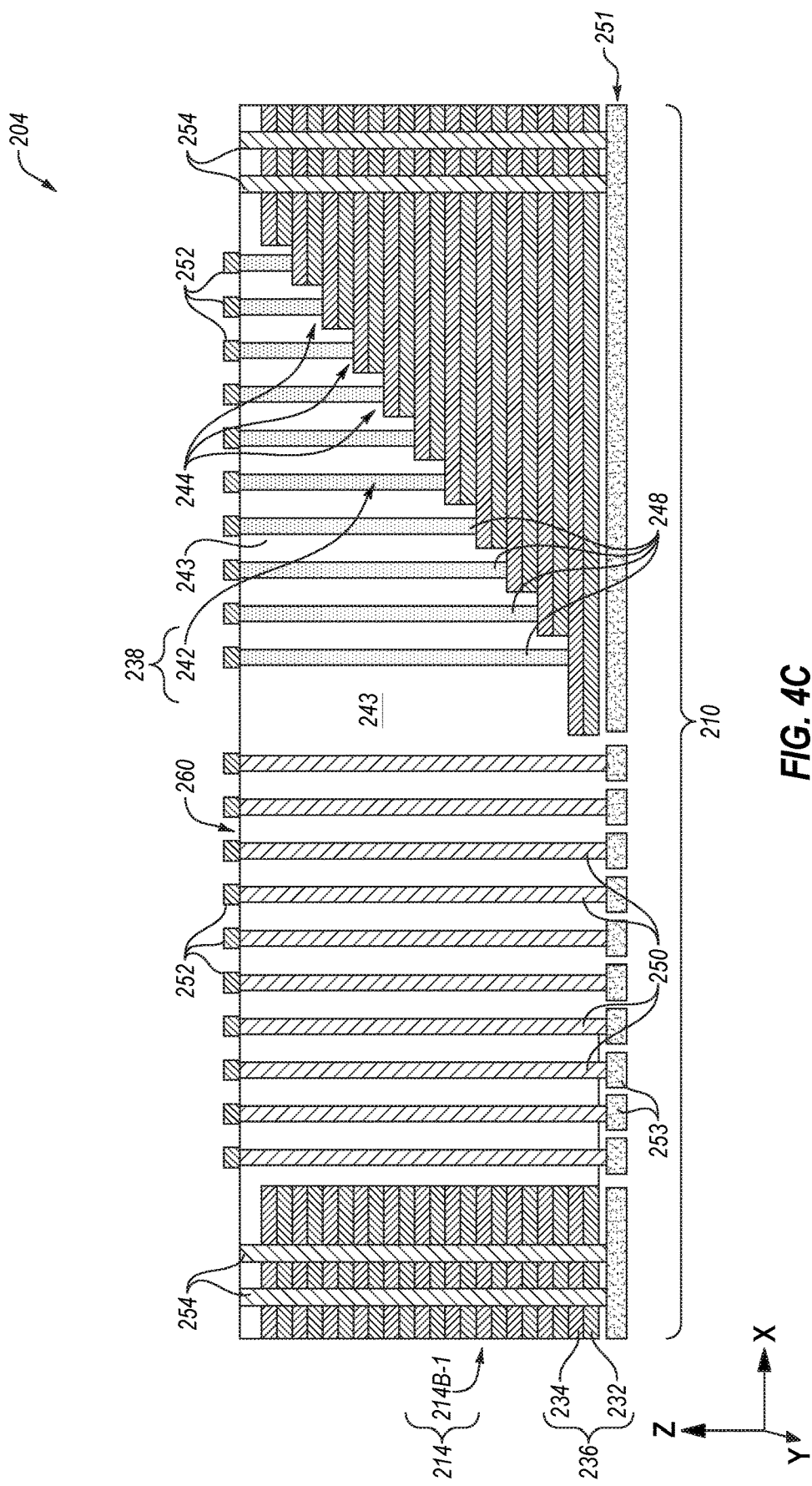
FIG. 4C is a simplified partial cross-sectional view of the memory structure shown in FIG. 4A about the line $B_2$-$B_2$ shown in FIG. 4A.

In additional embodiments, the memory structure 104 of the microelectronic device 100 (FIG. 1) may be formed to have a different configuration than the configuration previously described with reference to FIGS. 3A through 3C. By way of non-limiting example, FIG. 4A illustrates a simplified, partial plan view of a memory structure 204. The memory structure 204 may be employed in place of the memory structure 104 (FIGS. 1 and 3A through 3B) in the microelectronic device 100 (FIG. 1). FIG. 4B illustrates a simplified, partial cross-sectional view of the memory structure 204 about the line $A_2$-$A_2$ depicted in FIG. 4A. FIG. 4C illustrates a simplified, partial cross-sectional view of the memory structure 204 about the line $B_2$-$B_2$ depicted in FIG. 4A. Throughout FIGS. 4A through 4C and the associated description below, features (e.g., structures, materials, regions) functionally similar to features of the memory structure 104 previously described with reference to one or more of FIGS. 1 and 3A through 3C are referred to with similar reference numerals incremented by 100. To avoid repetition, not all features shown in FIGS. 4A through 4C are described in detail herein. Rather, unless described otherwise below, in FIGS. 4A through 4C, a feature designated by a reference numeral that is a 100 increment of the reference numeral of a feature previously described with reference to one or more of FIGS. 1 and 3A through 3C will be understood to be substantially similar to the previously described feature.

Referring to FIG. 4A, the conductively filled vias 250 may be positioned within filled trenches 260 (e.g., filled wells) vertically extending (e.g., in the Z-direction) through the blocks 214 of the memory structure 204. The filled trenches 260 may be filled with at least one electrically insulative material (e.g., the isolation material 243), and may vertically extend completely through portions of individual blocks 214 of the memory structure 204. Some of the filled trenches 260 may be horizontally interposed (e.g., in the Y-direction) between the forward staircase structures 240 of blocks 214 horizontally neighboring one another within the memory structure 204; and some other of the filled trenches 260 may be horizontally interposed (e.g., in the Y-direction) between the reverse staircase structures 242 of blocks 214 horizontally neighboring one another within the memory structure 204. As a non-limiting example, as shown in FIG. 4A, one of the filled trenches 260 may be horizontally interposed between a forward staircase structure 240 of the first even block 214A-1 and a forward staircase structure 240 of the first odd block 214B-1; and one other of the filled trenches 260 may be horizontally interposed between a reverse staircase structure 242 of the first even block 214A-1 and a reverse staircase structure 242 of the first odd block 214B-1. As another non-limiting example, as also shown in FIG. 4A, one of the filled trenches 260 may be horizontally interposed between a forward staircase structure 240 of the second even block 214A-2 and a forward staircase structure 240 of the second odd block 214B-2; and one other of the filled trenches 260 may be horizontally interposed between a reverse staircase structure 242 of the second even block 214A-2 and a reverse staircase structure 242 of the second odd block 214B-2.

With continued reference to FIG. 4A, for individual blocks 214 of the memory structure 204, the formation of the filled trenches 260 may reduce (e.g., narrow) a horizontal dimension in the Y-direction of one of the forward staircase structure 240 and the reverse staircase structure 242 of the block 214 relative to the other of the forward staircase structure 240 and the reverse staircase structure 242 of the block 214. For example, the forward staircase structure 240 of the first even block 214A-1 may have a relatively smaller horizontal dimension in the Y-direction than the reverse staircase structure 242 of the first even block 214A-1. As another example, the reverse staircase structure 242 of the first odd block 214B-1 may have a relatively smaller horizontal dimension in the Y-direction than the forward staircase structure 240 of the first odd block 214B-1. As an additional example, the forward staircase structure 240 of the second even block 214A-2 may have a relatively smaller horizontal dimension in the Y-direction than the reverse staircase structure 242 of the second even block 214A-2. As a further example, the reverse staircase structure 242 of the second odd block 214B-2 may have a relatively smaller horizontal dimension in the Y-direction than the forward staircase structure 240 of the second odd block 214B-2.

Referring to FIG. 4B, for an individual even block 214A (e.g., the first even block 214A-1) of the memory structure 204, conductively filled vias 250 may vertically extend in the Z-direction through the filled trench 260 horizontally neighboring, in the X-direction, the reverse staircase structure 242 of the stadium structure 238 of the even block 214A. In additional embodiments, for an individual even block 214A (e.g., the first even block 214A-1) of the memory structure 204, conductively filled vias 250 may vertically extend in the Z-direction through a filled trench 260 horizontally neighboring, in the X-direction, the forward staircase structure 240 of the stadium structure 238 of the even block 214A. As shown in FIG. 4B, the conductively filled vias 250 may vertically extend completely through the filled trench 260 to the conductive tier 251 underlying the tiers 236 of the even block 214A. The conductively filled vias 250 may be coupled to a group of the conductive structures 253 of the conductive tier 251. The conductive structures 253 of the group may be coupled to local contact structures 130 (FIG. 2) coupled to some of the string driver transistors 116 (FIG. 2) of the string driver circuitry 112 (FIG. 2) within the base structure 102 (FIGS. 1 and 2).

Referring next to FIG. 4C, for an individual odd block 214B (e.g., the first odd block 214B-1) of the memory structure 204, conductively filled vias 250 may vertically extend in the Z-direction through the filled trench 260 horizontally neighboring, in the X-direction, the forward staircase structure 240 of the stadium structure 238 of the odd block 214B. In additional embodiments, for an individual odd block 214B (e.g., the first odd block 214B-1) of the memory structure 204, conductively filled vias 250 may vertically extend in the Z-direction through a filled trench 260 horizontally neighboring, in the X-direction, the reverse staircase structure 242 of the stadium structure 238 of the odd block 214B. As shown in FIG. 4C, the conductively filled vias 250 may vertically extend completely through the filled trench 260 to the conductive tier 251 underlying the tiers 236 of the odd block 214B. The conductively filled vias 250 may be coupled to an additional group of the conductive structures 253 of the conductive tier 251. The conductive structures 253 of the additional group may be coupled to local contact structures 130 (FIG. 2) coupled to some other of the string driver transistors 116 (FIG. 2) of the string driver circuitry 112 (FIG. 2) within the base structure 102 (FIGS. 1 and 2).

With returned reference to FIG. 4A, in some embodiments, within an individual filled trench 260, conductively filled vias 250 are arranged in a single (e.g., only one (1)) row horizontally extending in the X-direction. In additional embodiments, within an individual filled trench 260, conductively filled vias 250 are arranged in multiple (e.g., two (2) or more) rows horizontally extending in the X-direction. The conductively filled vias 250 may be substantially uniformly (e.g., evenly) horizontally spaced apart (e.g., in the X-direction) within an individual filled trench 260, or may be at least partially non-uniformly (e.g., non-evenly) horizontally spaced apart (e.g., in the X-direction) within an individual filled trench 260.

Figure 5A:
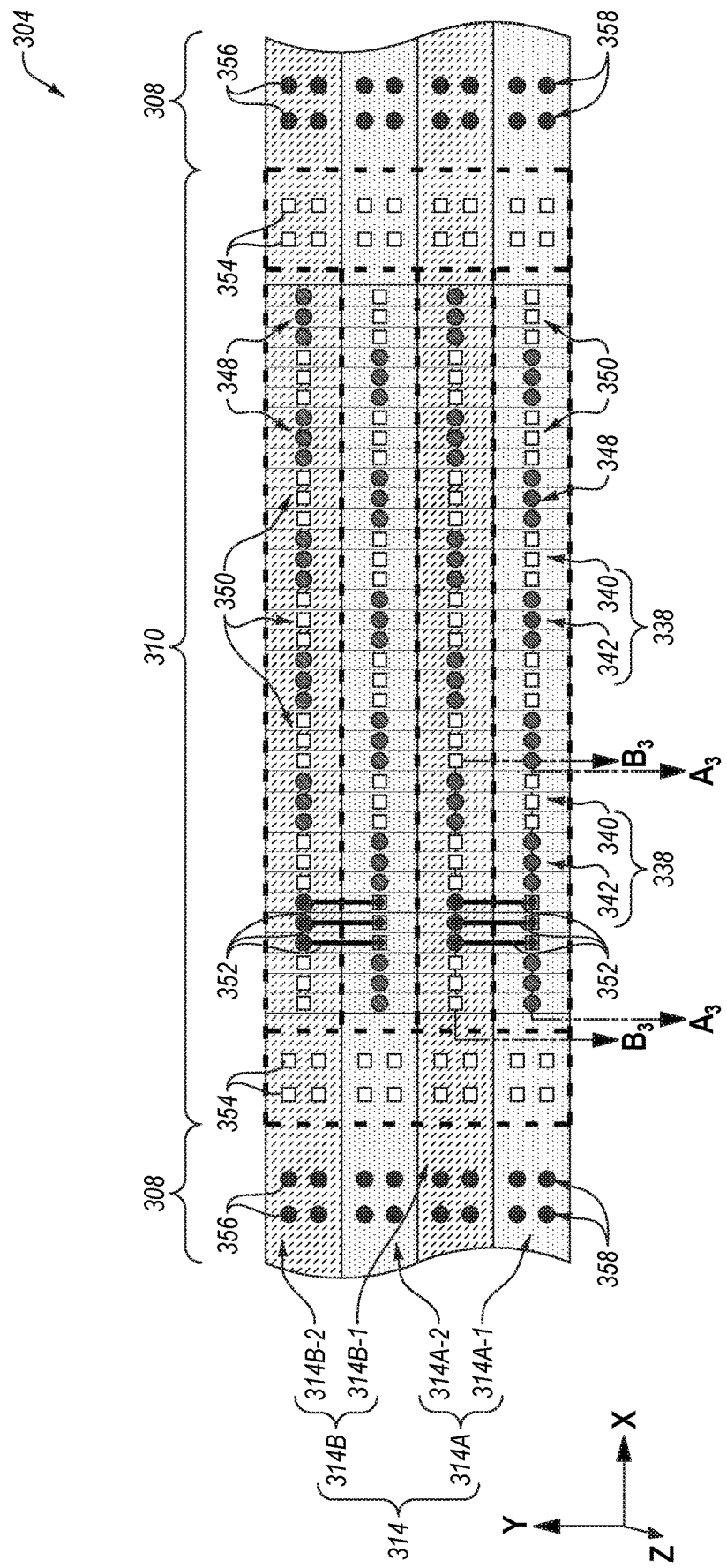
FIG. 5A is a simplified partial plan view of a memory structure for the microelectronic device shown in FIG. 1, in accordance with further embodiments of the disclosure.
Figure 5B:
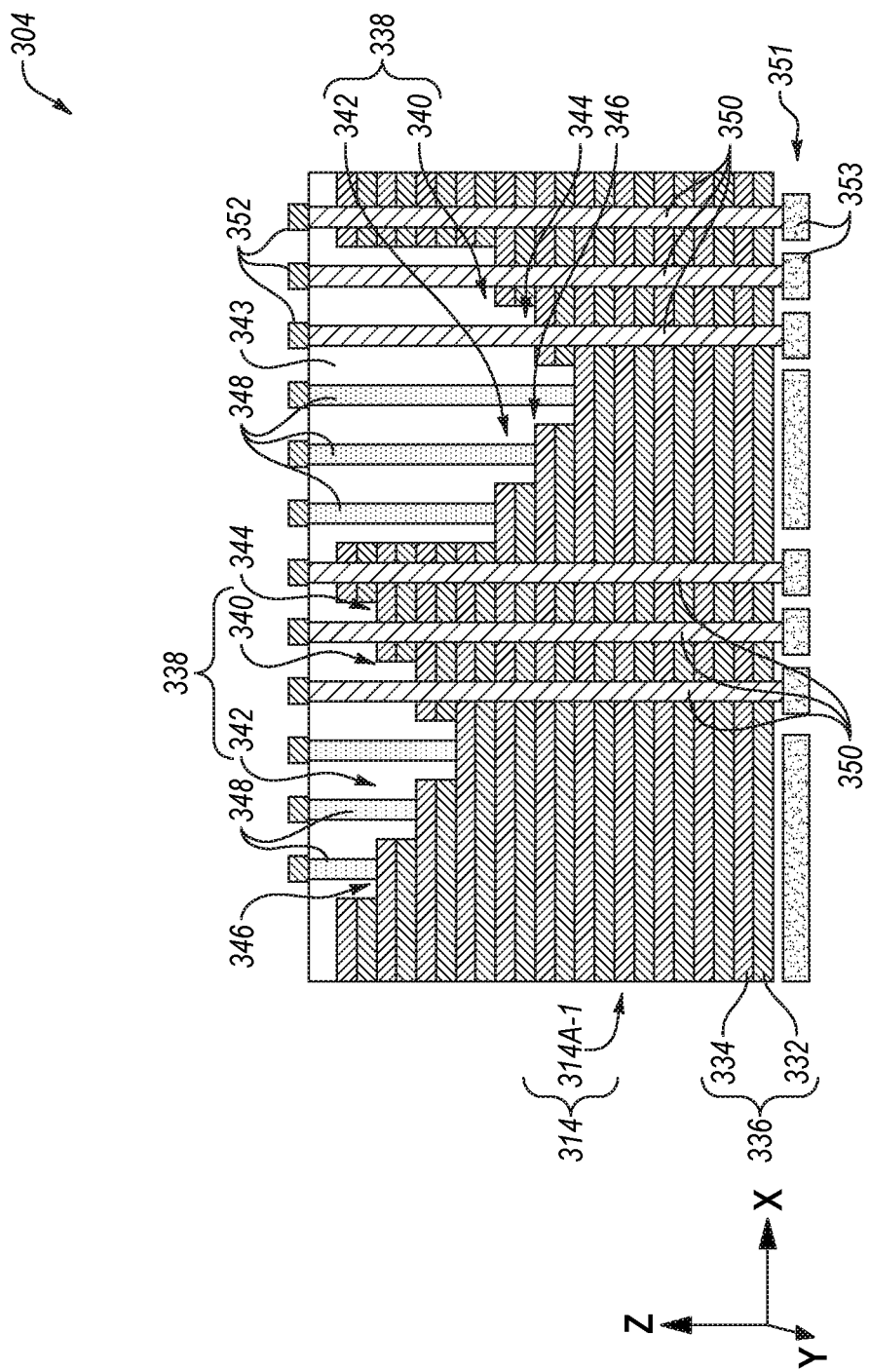
FIG. 5B is a simplified partial cross-sectional view of the memory structure shown in FIG. 5A about the line $A_3$-$A_3$ shown in FIG. 5A.
Figure 5C:
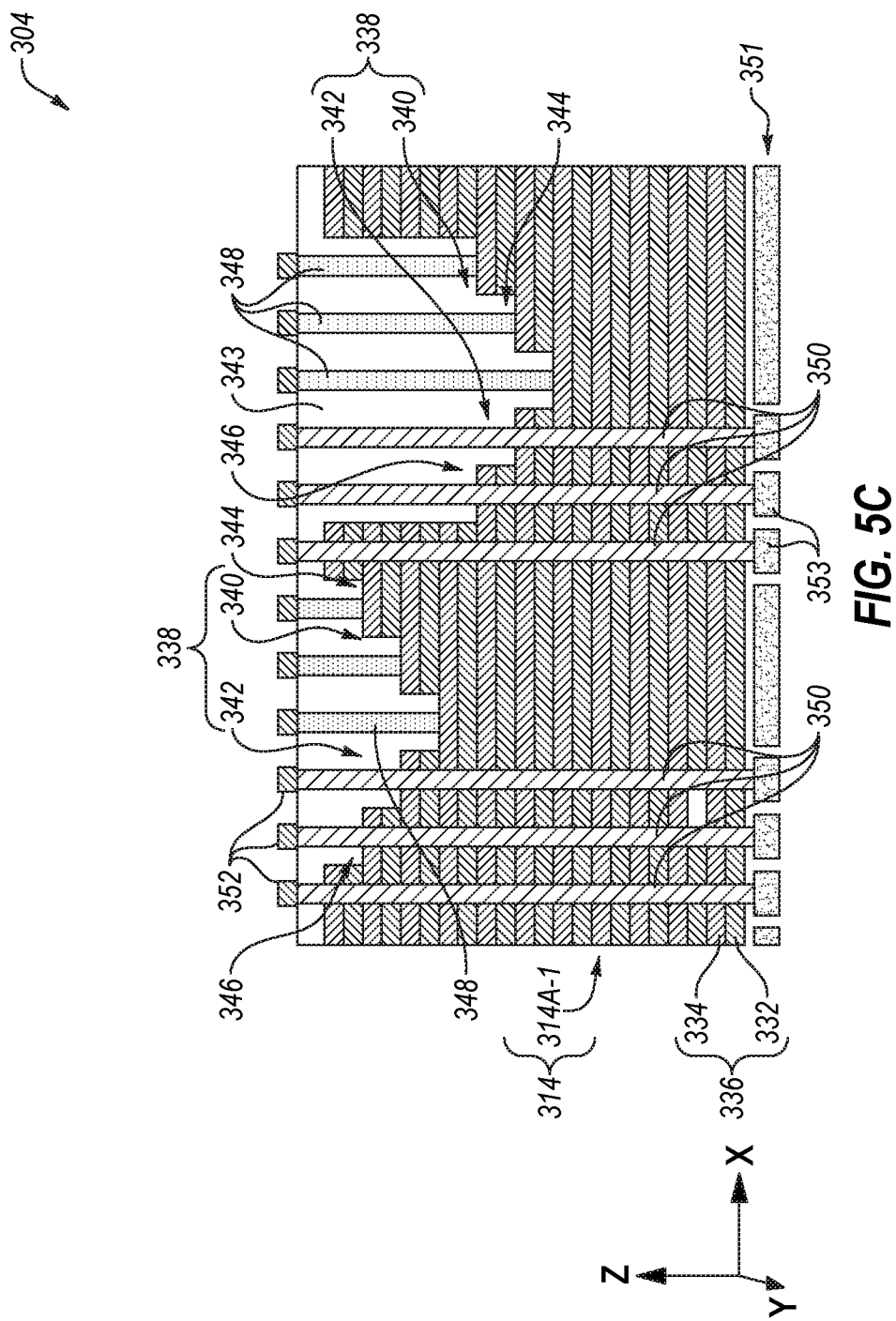
FIG. 5C is a simplified partial cross-sectional view of the memory structure shown in FIG. 5A about the line $B_3$-$B_3$ shown in FIG. 5A.

In further embodiments, the microelectronic device 100 (FIG. 1) may be formed to have a different memory structure configuration than the configurations of the memory structure 104 previously described with reference to FIGS. 3A through 3C and the memory structure 204 previously described with reference to FIGS. 4A through 4C. By way of non-limiting example, FIG. 5A illustrates a simplified, partial plan view of a memory structure 304. The memory structure 304 may be employed in place of the memory structure 104 (FIGS. 1 and 3A through 3B) in the microelectronic device 100 (FIG. 1). FIG. 5B illustrates a simplified, partial cross-sectional view of the memory structure 304 about the line $A_3$-$A_3$ depicted in FIG. 5A. FIG. 5C illustrates a simplified, partial cross-sectional view of the memory structure 304 about the line $B_3$-$B_3$ depicted in FIG. 5A. Throughout FIGS. 5A through 5C and the associated description below, features (e.g., structures, materials, regions) functionally similar to features of the memory structure 104 previously described with reference to one or more of FIGS. 1 and 3A through 3C are referred to with similar reference numerals incremented by 100. To avoid repetition, not all features shown in FIGS. 5A through 5C are described in detail herein. Rather, unless described otherwise below, in FIGS. 5A through 5C, a feature designated by a reference numeral that is a 100 increment of the reference numeral of a feature previously described with reference to one or more of FIGS. 1 and 3A through 3C will be understood to be substantially similar to the previously described feature.

Referring to FIG. 5A, within horizontal boundaries (e.g., in the X-direction) of the contact region 310, individual blocks 314 of the memory structure 304 include multiple (e.g., a plurality of, more than one) stadium structures 338 positioned at different vertical elevations (e.g., in the Z-direction) than one another within the block 314. For example, an individual block 314 (e.g., an individual even block 314A, an individual odd block 314B) of the memory structure 304 at least one stadium structure 338 located at a relatively higher vertical position (e.g., in the Z-direction) within the block 314, and at least one additional stadium structure 338 located at a relatively lower vertical position (e.g., in the Z-direction) within the block 314. The different vertical positions of the different stadium structures 338 within an individual block 314 of the memory structure 304 permits electrical connections between the conductive structures 334 of different tiers 336 of the block 314 and string driver transistors 116 (FIG. 2) within the base structure 102 (FIG. 2) without having to form a relatively larger stadium structure vertically spanning a relatively larger quantity (e.g., number) of the tiers 336 of the block 314.

Each block 314 of the memory structure 304 may individually include a desired quantity and distribution (e.g., spacing and arrangement) of the stadium structures 338. In some embodiments, each block 314 individually includes six (6) stadium structures 338; the stadium structures 338 are substantially uniformly (e.g., equally, evenly) spaced; and vertical positions (e.g., in the Z-direction) of the stadium structures 338 within the block 314 become deeper (e.g., vertically farther from a uppermost surface of the block 314, vertically closer to the lowermost surface of stadium structures 338) in either the positive X-direction or the negative X direction. In additional embodiments, one or more of the blocks 314 of the memory structure 304 may individually include a different quantity of the stadium structures 338 and/or a different distribution of the stadium structures 338 than that depicted in FIG. 5A. For example, one or more of the blocks 314 may individually include more than six (6) of the stadium structures 338 (e.g., greater than or equal to ten (10) of the stadium structures 338, greater than or equal to twenty-five (25) of the stadium structures 338, greater than or equal to fifty (50) of the stadium structures 338), or less than six (6) of the stadium structures 338 (e.g., less than or equal to five (5) of the stadium structures 338, less than or equal to three (3) of the stadium structures 338, two (2) of the stadium structures 338). As another example, the stadium structures 338 may be at least partially non-uniformly (e.g., non-equally, non-evenly) spaced, such that at least one of the stadium structures 338 is separated from at least two other of the stadium structures 338 horizontally neighboring (e.g., in the X-direction) the at least one stadium structures 338 by different (e.g., non-equal) distances. As an additional non-limiting example, within an individual block 314, vertical positions (e.g., in the Z-direction) of the stadium structures 338 within the block 314 may vary in another manner (e.g., may alternate between relatively deeper and relatively shallower vertical positions, may alternate between relatively shallower and relatively deeper vertical positions) in the X-direction.

Referring to FIG. 5B, for an individual even block 314A (e.g., the first even block 314A-1) of the memory structure 304, the conductive contact structures 348 may be coupled to different conductive structures 334 of the tiers 336 of the even block 314A at the additional steps 346 of the reverse staircase structure 342 of each of the stadium structures 338 within the even block 314A. As shown in FIG. 5B, the conductive contact structures 348 may vertically extend (e.g., in the Z-direction) through the isolation material 343, and may physically contact (e.g., land on) some of the conductive structures 334 of the even block 314A at the additional steps 346 of the reverse staircase structure 342 of each individual stadium structure 338. In additional embodiments, for an individual even block 314A (e.g., the first even block 314A-1) of the memory structure 304, the conductive contact structures 348 may be coupled to different conductive structures 334 of the tiers 336 of the even block 314A at the steps 344 of the forward staircase structure 340 of each of the stadium structures 338 within the even block 314A. The conductive contact structures 348 may vertically extend (e.g., in the Z-direction) through the isolation material 343, and may physically contact (e.g., land on) some of the conductive structures 334 of the even block 314A at the steps 344 of the forward staircase structure 340 of each individual stadium structure 338.

With continued reference to FIG. 5B, for an individual even block 314A (e.g., the first even block 314A-1) of the memory structure 304, the conductively filled vias 350 may vertically extend (e.g., in the Z-direction) through portions of the isolation material 343 and the tiers 336 of the even block 314A within horizontal boundaries of the forward staircase structure 340 of each of the stadium structures 338 within the even block 314A. In additional embodiments, for an individual even block 314A (e.g., the first even block 314A-1) of the memory structure 304, the conductively filled vias 350 may vertically extend (e.g., in the Z-direction) through portions of the isolation material 343 and the tiers 336 of the even block 314A within horizontal boundaries of the reverse staircase structure 342 of each of the stadium structures 338 within the even block 314A. As shown in FIG. 5B, the conductively filled vias 350 may vertically extend to the conductive tier 351 underlying the tiers 336 of the even block 314A. The conductively filled vias 350 may be coupled to a group of the conductive structures 353 of the conductive tier 351. The conductive structures 353 of the group may be coupled to local contact structures 130 (FIG. 2) coupled to some other of the string driver transistors 116 (FIG. 2) of the string driver circuitry 112 (FIG. 2) within the base structure 102 (FIGS. 1 and 2).

Referring to next to FIG. 5C, for an individual odd block 314B (e.g., the first odd block 314B-1) of the memory structure 304, the conductive contact structures 348 may be coupled to different conductive structures 334 of the tiers 336 of the odd block 314B at the steps 344 of the forward staircase structure 340 of each of the stadium structures 338 within the odd block 314B. As shown in FIG. 5C, the conductive contact structures 348 may vertically extend (e.g., in the Z-direction) through the isolation material 343, and may physically contact (e.g., land on) some of the conductive structures 334 of the odd block 314B at the steps 344 of the forward staircase structure 340. In additional embodiments, such as embodiments wherein conductive contact structures 348 within horizontal boundaries of an even block 314A (FIGS. 5A and 5B) horizontally neighboring the odd block 314B contact steps 344 of a forward staircase structure 340 of the even block 314A (FIGS. 5A and 5B), conductive contact structures 348 within horizontal boundaries of the odd block 314B may be coupled some of the conductive structures 334 of the tiers 336 of the odd block 314B at the additional steps 346 of the reverse staircase structure 342 of the odd block 314B. The conductive contact structures 348 may vertically extend (e.g., in the Z-direction) through the isolation material 343, and may physically contact (e.g., land on) some of the conductive structures 334 of the odd block 314B at the additional steps 346 of the reverse staircase structure 342 of each individual stadium structure 338.

With continued reference to FIG. 5C, for an individual odd block 314B (e.g., the first odd block 314B-1) of the memory structure 304, the conductively filled vias 350 may vertically extend (e.g., in the Z-direction) through portions of the isolation material 343 and the tiers 336 of the odd block 314B within horizontal boundaries of the reverse staircase structure 342 of each of the stadium structures 338 within the odd block 314B. In additional embodiments, such as embodiments wherein conductively filled vias 350 within horizontal boundaries of an even block 314A (FIGS. 5A and 5B) horizontally neighboring the odd block 314B vertically extend through portions of the even block 314A within horizontal boundaries of the reverse staircase structures 342 of the even block 314A, the conductively filled vias 350 of the odd block 314B may vertically extend (e.g., in the Z-direction) through portions of the isolation material 343 and the tiers 336 of the odd block 314B within horizontal boundaries of the forward staircase structures 340 of the odd block 314B. As shown in FIG. 5C, the conductively filled vias 350 may vertically extend to the conductive tier 351 underlying the tiers 336 of the odd block 314B. The conductively filled vias 350 may be coupled to an additional group of the conductive structures 353 of the conductive tier 351. The conductive structures 353 of the additional group may be coupled to local contact structures 130 (FIG. 2) coupled to some other of the string driver transistors 116 (FIG. 2) of the string driver circuitry 112 (FIG. 2) within the base structure 102 (FIGS. 1 and 2).

Microelectronic device structures and microelectronic devices in accordance with embodiments of the disclosure may be used in embodiments of electronic systems of the disclosure. For example, FIG. 6 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of a microelectronic device previously described herein. The electronic system 400 may further include at least one electronic signal processor device 404 (often referred to as a "microprocessor"). The electronic signal processor device 404 may, optionally, include an embodiment of a microelectronic device previously described herein. While the memory device 402 and the electronic signal processor device 404 are depicted as two (2) separate devices in FIG. 6, in additional embodiments, a single (e.g., only one) memory/processor device having the functionalities of the memory device 402 and the electronic signal processor device 404 is included in the electronic system 400. In such embodiments, the memory/processor device may include a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system according to embodiments of the disclosure comprises an input device, an output device, a processor device operably coupled to the input device and the output device, and a memory device operably coupled to the processor device. The memory device comprises blocks, conductive contact structures, conductively filled vias, interconnect structures, additional interconnect structures, and a base structure. The blocks each have a vertically alternating sequence of conductive structures and insulative structures arranged in tiers. Each block comprises a forward staircase structure having steps comprising edges of the tiers of the block, and a reverse staircase structure opposing the forward staircase structure and having additional steps comprising additional edges of the tiers of the block. The conductive contact structures are on the steps of the forward staircase structure of a first of the blocks and on the additional steps of the reverse staircase structure of a second of the blocks horizontally neighboring the first of the blocks. The conductively filled vias vertically extend through the first of the blocks at the additional steps of the reverse staircase structure of the first of the blocks and vertically extend through the second of the blocks at the steps of the forward staircase structure of the second of the blocks. The interconnect structures couple a group of the conductive contact structures on the steps of the forward staircase structure of the first of the blocks to a group of the conductively filled vias vertically extending through the second of the blocks at the steps of the forward staircase structure of the second of the blocks. The additional interconnect structures couple an additional group of the conductive contact structures on the additional steps of the reverse staircase structure of the second of the blocks to an additional group of the conductive contact structures on the additional steps of the reverse staircase structure of the first of the blocks. The base structure underlies the blocks and comprises rows of string driver transistors coupled to the conductively filled vias.

The devices, structures, and methods of the disclosure advantageously facilitate improved microelectronic device performance, reduced costs (e.g., manufacturing costs, material costs), increased miniaturization of components, and greater packaging density as compared to conventional devices, conventional structures, and conventional methods. The devices, structures, and methods of the disclosure may also improve performance, scalability, efficiency, and simplicity as compared to conventional devices, conventional structures, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
blocks each having a vertically alternating sequence of conductive structures and insulative structures arranged in tiers, each of the blocks comprising:
a forward staircase structure having steps comprising edges of the tiers; and
a reverse staircase structure opposing the forward staircase structure and having additional steps comprising additional edges of the tiers; and
conductive contact structures on the steps of the forward staircase structure of a first of the blocks and on the additional steps of the reverse staircase structure of a second of the blocks horizontally neighboring the first of the blocks in a first direction;
conductively filled vias vertically extending through portions of the first of the blocks within horizontal boundaries of the reverse staircase structure of the first of the blocks and vertically extending through portions of the second of the blocks within horizontal boundaries of the forward staircase structure of the second of the blocks; and
a base structure underlying the blocks and comprising transistors coupled to the conductively filled vias, each of the blocks individually having a pair of rows of the transistors of the base structure coupled thereto.

2. The microelectronic device of claim 1, further comprising:
first global word lines coupled to the transistors within a first row of the pair of rows of the transistors; and
second global word lines horizontally neighboring the first global word lines in a second direction orthogonal to the first direction, the second global word lines coupled to the transistors within a second row of the pair of rows of the transistors.

3. The microelectronic device of claim 2, further comprising:
a first block select line coupled to gates of the transistors within the first row of the pair of rows of the transistors; and
a second block select line horizontally neighboring the first block select line in the first direction, the second block select line coupled to the transistors within the second row of the pair of rows of the transistors.

4. The microelectronic device of claim 1, wherein:
the first of the blocks has a first pair of the rows of the transistors coupled thereto; and
the second of the blocks has a second pair of the rows of the transistors coupled thereto, the second pair of the rows of the transistors horizontally neighboring the first pair of the rows of the transistors in a second direction orthogonal to the first direction.

5. The microelectronic device of claim 4, wherein the first pair of the rows of the transistors and the second pair of the rows of the transistors are individually confined with combined horizontal boundaries in the first direction of the first of the blocks and the second of the blocks.

6. The microelectronic device of claim 1, further comprising:
first interconnect structures coupling the conductive contact structures on the steps of the forward staircase structure of a first of the blocks with the conductively filled vias vertically extending through the portions of the second of the blocks within the horizontal boundaries of the forward staircase structure of the second of the blocks; and
second interconnect structures coupling the conductive contact structures on the additional steps of the reverse staircase structure of a first of the blocks with the conductively filled vias vertically extending through the portions of the second of the blocks within the horizontal boundaries of the reverse staircase structure of the second of the blocks.

7. A microelectronic device, comprising:
blocks each having a vertically alternating sequence of conductive structures and insulative structures arranged in tiers, each of the blocks comprising:
  a forward staircase structure having steps comprising edges of the tiers; and
  a reverse staircase structure opposing the forward staircase structure and having additional steps comprising additional edges of the tiers; and
  conductive contact structures on the steps of the forward staircase structure of a first of the blocks and on the additional steps of the reverse staircase structure of a second of the blocks horizontally neighboring the first of the blocks in a first direction;
conductively filled vias vertically extending through portions of the first of the blocks within horizontal boundaries of the reverse staircase structure of the first of the blocks and vertically extending through portions of the second of the blocks within horizontal boundaries of the forward staircase structure of the second of the blocks,
  some of the conductively filled vias vertically extending through a first filled trench comprising dielectric material horizontally interposed between the reverse staircase structure of the first of the blocks and the reverse staircase structure of the second of the blocks, and
  some other of the conductively filled vias vertically extending through a second filled trench comprising dielectric material horizontally interposed between the forward staircase structure of the first of the blocks and the forward staircase structure of the second of the blocks; and
a base structure underlying the blocks and comprising transistors coupled to the conductively filled vias.

8. A 3D NAND Flash memory device, comprising:
a memory structure comprising blocks each having tiers comprising a conductive structure and an insulative structure vertically neighboring the conductive structure;
at least one stadium structure within a contact region of each block of the memory structure, the at least one stadium structure comprising opposing staircase structures each having steps comprising edges of the tiers of the block;
conductive contact structures on the steps of a first of the opposing staircase structures of at least one of the blocks and on a second of the opposing staircase structures of at least one other of the blocks horizontally neighboring the at least one of the blocks;
additional conductive structures vertically extending through the at least one of the blocks at the steps of a second of the opposing staircase structures of the at least one of the blocks and vertically extending through the at least one other of the blocks at the steps of a first of the opposing staircase structures of the at least one other of the blocks;
vertically extending strings of memory cells within memory array regions of each block of the memory structure; and
a base structure vertically underlying the memory structure and comprising string driver circuitry within horizontal boundaries of the contact region of each block of the memory structure, the string driver circuitry comprising rows of string driver transistors coupled to the additional conductive structures and to global word lines.

9. The 3D NAND Flash memory device of claim 8, wherein:
groups of the conductive contact structures on the steps of the first of the opposing staircase structures of the at least one of the blocks are coupled to groups of the additional conductive structures vertically extending through the at least one other of the blocks at the steps of the first of the opposing staircase structures of the at least one other of the blocks; and
additional groups of the conductive contact structures on the steps of the second of the opposing staircase structures of the at least one of the blocks are coupled to additional groups of the additional conductive structures vertically extending through the at least one other of the blocks at the steps of the second of the opposing staircase structures of the at least one other of the blocks.

10. The 3D NAND Flash memory device of claim 8, wherein each of the blocks of the memory structure is individually coupled to two horizontally neighboring rows of the rows of the string driver transistors of the string driver circuitry.

11. The 3D NAND Flash memory device of claim 10, further comprising:
pairs of global word lines extending perpendicular to the rows of the string driver transistors, a first global word line of each of the pairs of global word lines coupled to a different string driver transistor within the two horizontally neighboring rows of the rows of the string driver transistors than a second global word line of each of the pairs of global word lines; and
pairs of block select lines extending parallel to the rows of the string driver transistors, a first block select line of each of the pairs of block select lines coupled different string driver transistors within the two horizontally neighboring rows of the rows of the string driver transistors than a second block select line of each of the pairs of block select lines.

12. An electronic system, comprising:
an input device;
an output device;
a processor device operably coupled to the input device and the output device; and
a memory device operably coupled to the processor device and comprising:
blocks each having a vertically alternating sequence of conductive structures and insulative structures arranged in tiers, each block comprising:
  a forward staircase structure having steps comprising edges of the tiers of the block; and
  a reverse staircase structure opposing the forward staircase structure and having additional steps comprising additional edges of the tiers of the block;

conductive contact structures on the steps of the forward staircase structure of a first of the blocks and on the additional steps of the reverse staircase structure of a second of the blocks horizontally neighboring the first of the blocks;

conductively filled vias vertically extending through the first of the blocks at the additional steps of the reverse staircase structure of the first of the blocks and vertically extending through the second of the blocks at the steps of the forward staircase structure of the second of the blocks;

interconnect structures coupling a group of the conductive contact structures on the steps of the forward staircase structure of the first of the blocks to a group of the conductively filled vias vertically extending through the second of the blocks at the steps of the forward staircase structure of the second of the blocks;

additional interconnect structures coupling an additional group of the conductive contact structures on the additional steps of the reverse staircase structure of the second of the blocks to an additional group of the conductive contact structures on the additional steps of the reverse staircase structure of the first of the blocks; and a base structure underlying the blocks and comprising rows of string driver transistors coupled to the conductively filled vias.

13. The electronic system of claim 12, wherein the memory device comprises a 3D NAND Flash memory device.

* * * * *

UNITED STATES PATENT AND TRADEMARK OFFICE
CERTIFICATE OF CORRECTION

PATENT NO. : 11,437,318 B2
APPLICATION NO. : 16/900204
DATED : September 6, 2022
INVENTOR(S) : Qui V. Nguyen and Chang H. Siau It is certified that error appears in the above-identified patent and that said Letters Patent is hereby corrected as shown below:

In the Specification

| | | |
|---|---|---|
| Column 4, | Line 54, | change ""x", "y"," to --"x," "y,"-- |
| Column 4, | Line 63, | change ""x", "y"," to --"x," "y,"-- |
| Column 7, | Line 43, | change "Di" to --$D_1$-- |
| Column 8, | Line 17, | change "Wi" to --$W_1$-- |

Signed and Sealed this
Thirteenth Day of December, 2022

Katherine Kelly Vidal
*Director of the United States Patent and Trademark Office*